United States Patent
Lai et al.

(10) Patent No.: US 10,910,393 B2
(45) Date of Patent: Feb. 2, 2021

(54) 3D NOR MEMORY HAVING VERTICAL SOURCE AND DRAIN STRUCTURES

(71) Applicant: MACRONIX INTERNATIONAL CO., LTD., Hsinchu (TW)

(72) Inventors: Erh-Kun Lai, Longling Shiang (TW); Hsiang-Lan Lung, Kaohsiung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/394,363

(22) Filed: Apr. 25, 2019

(65) Prior Publication Data
US 2020/0343252 A1    Oct. 29, 2020

(51) Int. Cl.
| | |
|---|---|
| H01L 27/1157 | (2017.01) |
| G11C 5/06 | (2006.01) |
| G11C 16/04 | (2006.01) |
| H01L 27/11582 | (2017.01) |

(52) U.S. Cl.
CPC .......... *H01L 27/1157* (2013.01); *G11C 5/063* (2013.01); *G11C 16/0466* (2013.01); *H01L 27/11582* (2013.01)

(58) Field of Classification Search
CPC .......... H01L 27/1157; H01L 27/11582; H01L 27/2481; G11C 5/063; G11C 16/0466
See application file for complete search history.

(56) References Cited

U.S. PATENT DOCUMENTS

| | | |
|---|---|---|
| 4,219,829 A | 8/1980 | Dorda et al. |
| 4,987,090 A | 1/1991 | Hsu et al. |
| 5,586,073 A | 12/1996 | Hiura et al. |

(Continued)

FOREIGN PATENT DOCUMENTS

| | | |
|---|---|---|
| EP | 2048709 A2 | 4/2009 |
| TW | 201523838 A | 6/2015 |

(Continued)

OTHER PUBLICATIONS

Chen et al., "Eyeriss: An Energy-Efficient reconfigurable accelerator for deep convolutional neural networks," IEEE ISSCC, Jan. 31-Feb. 4, 2016, 3 pages.

(Continued)

*Primary Examiner* — Julia Slutsker
(74) *Attorney, Agent, or Firm* — Haynes Beffel & Wolfeld LLP

(57) ABSTRACT

A memory device comprises a plurality of stacks of word lines alternating with insulating strips, the stacks being separated by trenches, the word lines extending in a first direction. A plurality of columns of vertical conductive structures is disposed in the trenches between adjacent stacks. Multi-layer films of memory material and channel material are disposed on sidewalls of word lines on at least one side of the trenches between adjacent vertical conductive structures in the plurality of vertical conductive structure, the channel material in ohmic contact with the vertical conductive structures. At locations of vertical conductive structures in the plurality of vertical conductive structures, the sidewalls of the word lines are recessed between insulating strips in the stacks to form recesses on the sidewalls of the word lines to isolate the word lines from vertical conductive structures.

20 Claims, 19 Drawing Sheets

(56) References Cited

U.S. PATENT DOCUMENTS

| | | |
|---|---|---|
| 6,107,882 A | 8/2000 | Gabara et al. |
| 6,313,486 B1 | 11/2001 | Kencke et al. |
| 6,829,598 B2 | 12/2004 | Milev |
| 6,906,940 B1 | 6/2005 | Lue |
| 6,960,499 B2 | 11/2005 | Nandakumar et al. |
| 7,368,358 B2 | 5/2008 | Ouyang et al. |
| 7,747,668 B2 | 6/2010 | Nomura et al. |
| 8,203,187 B2 | 6/2012 | Lung et al. |
| 8,275,728 B2 | 9/2012 | Pino |
| 8,432,719 B2 | 4/2013 | Lue |
| 8,589,320 B2 | 11/2013 | Breitwisch et al. |
| 8,630,114 B2 | 1/2014 | Lue |
| 8,860,124 B2 | 10/2014 | Lue et al. |
| 9,064,903 B2 | 6/2015 | Mitchell et al. |
| 9,379,129 B1 | 6/2016 | Lue et al. |
| 9,430,735 B1 | 8/2016 | Vali et al. |
| 9,431,099 B2 | 8/2016 | Lee et al. |
| 9,524,980 B2 | 12/2016 | Lue |
| 9,536,969 B2 | 1/2017 | Yang et al. |
| 9,589,982 B1 | 3/2017 | Cheng et al. |
| 9,698,156 B2 | 7/2017 | Lue |
| 9,698,185 B2 | 7/2017 | Chen et al. |
| 9,710,747 B2 | 7/2017 | Kang et al. |
| 9,754,953 B2 | 9/2017 | Tang et al. |
| 10,242,737 B1 | 3/2019 | Lin et al. |
| 10,777,566 B2 | 9/2020 | Lue |
| 2003/0122181 A1 | 7/2003 | Wu |
| 2005/0287793 A1 | 12/2005 | Blanchet et al. |
| 2010/0148237 A1* | 6/2010 | Kito ............ H01L 27/11556 257/315 |
| 2010/0182828 A1 | 7/2010 | Shima et al. |
| 2010/0202208 A1 | 8/2010 | Endo et al. |
| 2011/0063915 A1 | 3/2011 | Tanaka et al. |
| 2011/0106742 A1 | 5/2011 | Pino |
| 2011/0286258 A1 | 11/2011 | Chen et al. |
| 2011/0297912 A1 | 12/2011 | Samachisa et al. |
| 2012/0001250 A1* | 1/2012 | Alsmeier .......... H01L 27/11551 257/319 |
| 2012/0044742 A1 | 2/2012 | Narayanan |
| 2012/0235111 A1 | 9/2012 | Osano et al. |
| 2013/0075684 A1 | 3/2013 | Kinoshita et al. |
| 2014/0063949 A1 | 3/2014 | Tokiwa |
| 2014/0103530 A1* | 4/2014 | Lai ................ H01L 21/76889 257/755 |
| 2014/0119127 A1 | 5/2014 | Lung et al. |
| 2014/0268996 A1 | 9/2014 | Park |
| 2015/0008500 A1 | 1/2015 | Fukumoto et al. |
| 2016/0141337 A1 | 5/2016 | Shimabukuro et al. |
| 2016/0181315 A1 | 6/2016 | Lee et al. |
| 2016/0247579 A1 | 8/2016 | Ueda et al. |
| 2016/0308114 A1 | 10/2016 | Kim et al. |
| 2016/0336064 A1 | 11/2016 | Seo et al. |
| 2016/0358661 A1 | 12/2016 | Vali et al. |
| 2017/0092370 A1 | 3/2017 | Harari |
| 2017/0148517 A1 | 5/2017 | Harari |
| 2017/0169887 A1 | 6/2017 | Widjaja |
| 2017/0270405 A1 | 9/2017 | Kurokawa |
| 2017/0309634 A1 | 10/2017 | Noguchi et al. |
| 2017/0316833 A1 | 11/2017 | Ihm et al. |
| 2017/0317096 A1 | 11/2017 | Shin et al. |
| 2018/0121345 A1* | 5/2018 | Li ........................ G11C 16/26 |
| 2018/0121790 A1 | 5/2018 | Kim et al. |
| 2018/0350823 A1 | 12/2018 | Or-Bach et al. |
| 2019/0148393 A1 | 5/2019 | Lue |
| 2019/0220249 A1 | 7/2019 | Lee et al. |
| 2019/0244662 A1 | 8/2019 | Lee et al. |
| 2019/0286419 A1 | 9/2019 | Lin et al. |
| 2020/0006432 A1* | 1/2020 | Grobis .............. G11C 11/1675 |
| 2020/0026993 A1 | 1/2020 | Otsuka |

FOREIGN PATENT DOCUMENTS

| | | |
|---|---|---|
| TW | 201639206 A | 11/2016 |
| TW | 201732824 A | 9/2017 |
| WO | 2012015450 A1 | 2/2012 |
| WO | 2017091338 A1 | 6/2017 |

OTHER PUBLICATIONS

Gonugondla et al., "Energy-Efficient Deep In-memory Architecture for NAND Flash Memories," IEEE International Symposium on Circuits and Systems (ISCAS), May 27-30, 2018, 5 pages.

Wang et al., "Three-Dimensional NAND Flash for Vector-Matrix Multiplication," IEEE Trans. on Very Large Scale Integration Systems (VLSI), vol. 27, No. 4, Apr. 2019, 4 pages.

Jang et al., "Vertical cell array using TCAT(Terabit Cell Array Transistor) technology for ultra high density NAND flash memory," 2009 Symposium on VLSI Technology, Honolulu, HI, Jun. 16-18, 2009, pp. 192-193.

Jung et al, "Three Dimensionally Stacked NAND Flash Memory Technology Using Stacking Single Crystal Si Layers on ILD and TANOS Structure for Beyond 30nm Node," International Electron Devices Meeting, 2006. IEDM '06, Dec. 11-13, 2006, pp. 1-4.

Kim et al. "Multi-Layered Vertical Gate NAND Flash Overcoming Stacking Limit for Terabit Density Storage," 2009 Symposium on VLSI Technology Digest of Papers, Jun. 16-18, 2009, 2 pages.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technolgy Digest of Technical Papers, pp. 186-187. (cited in parent).

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Lue et al., "A Novel 3D AND-type NVM Architecture Capable of High-density, Low-power In-Memory Sum-of-Product Computation for Artificial Intelligence Application," IEEE VLSI, Jun. 18-22, 2018, 2 pages.

Ohzone et al., "Ion-Implanted Thin Polycrystalline-Silicon High-Value Resistors for High-Density Poly-Load Static RAM Applications," IEEE Trans. on Electron Devices, vol. ED-32, No. 9, Sep. 1985, 8 pages.

Sakai et al., "A Buried Giga-Ohm Resistor (BGR) Load Static RAM Cell," IEEE Symp. on VLSI Technology, Digest of Papers, Sep. 10-12, 1984, 2 pages.

Schuller et al., "Neuromorphic Computing: From Materials to Systems Architecture," US Dept. of Energy, Oct. 29-30, 2015, Gaithersburg, MD, 40 pages.

Seo et al., "A Novel 3-D Vertical FG NAND Flash Memory Cell Arrays Using the Separated Sidewall Control Gate (S-SCG) for Highly Reliable MLC Operation," 2011 3rd IEEE International Memory Workshop (IMW), May 22-25, 2011, 4 pages.

Soudry, et al. "Hebbian learning rules with memristors," Center for Communication and Information Technologies CCIT Report #840, Sep. 1, 2013, 16 pages.

Tanaka H., et al., "Bit Cost Scalable Technology with Punch and Plug Process for Ultra High Density Flash Memory," 2007 Symp. VLSI Tech., Digest of Tech. Papers, pp. 14-15.

Whang, SungJin et al. "Novel 3-dimensional Dual Control-gate with Surrounding Floating-gate (DC-SF) NAND flash cell for 1Tb file storage application," 2010 IEEE Int'l Electron Devices Meeting (IEDM), Dec. 6-8, 2010, 4 pages.

* cited by examiner

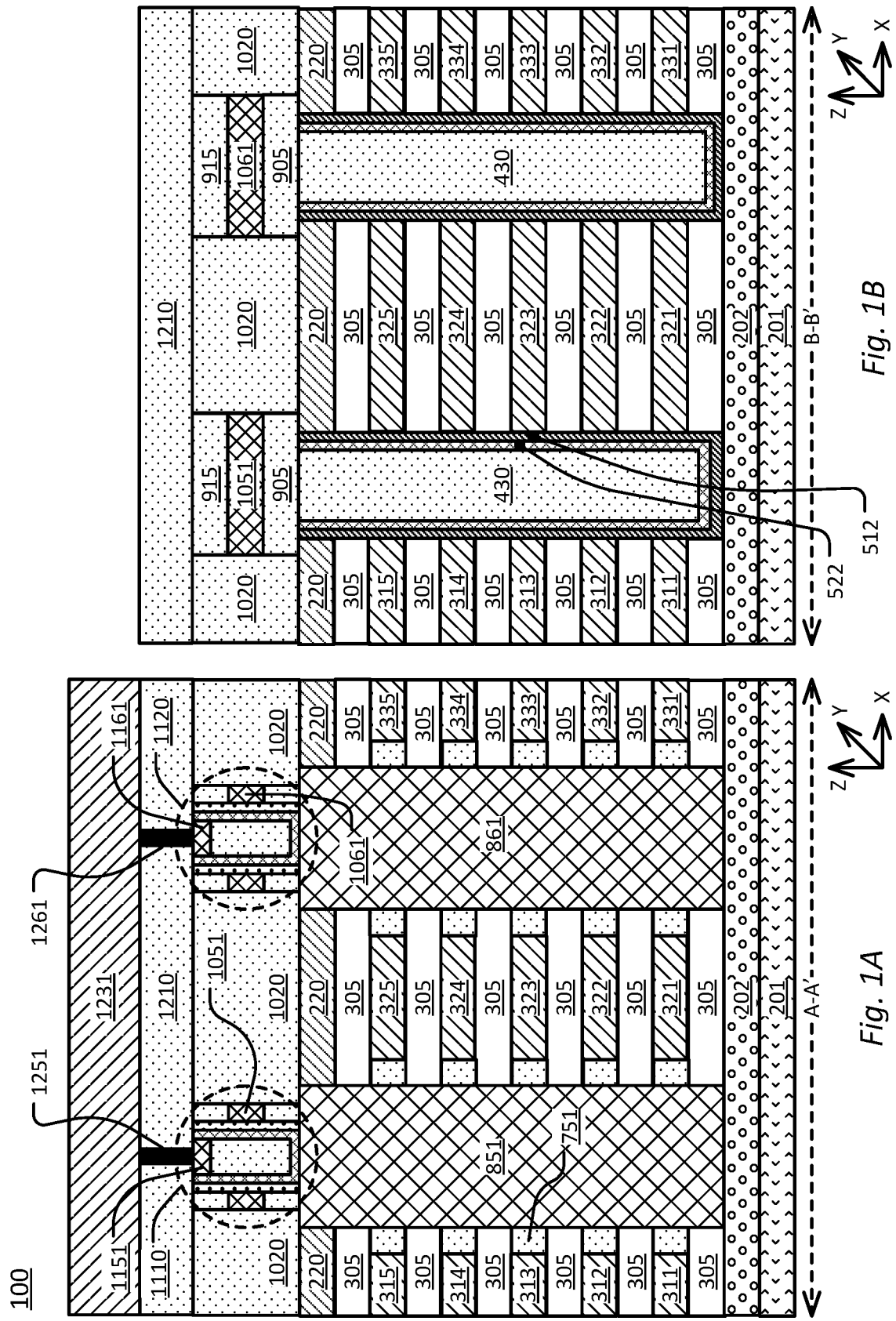

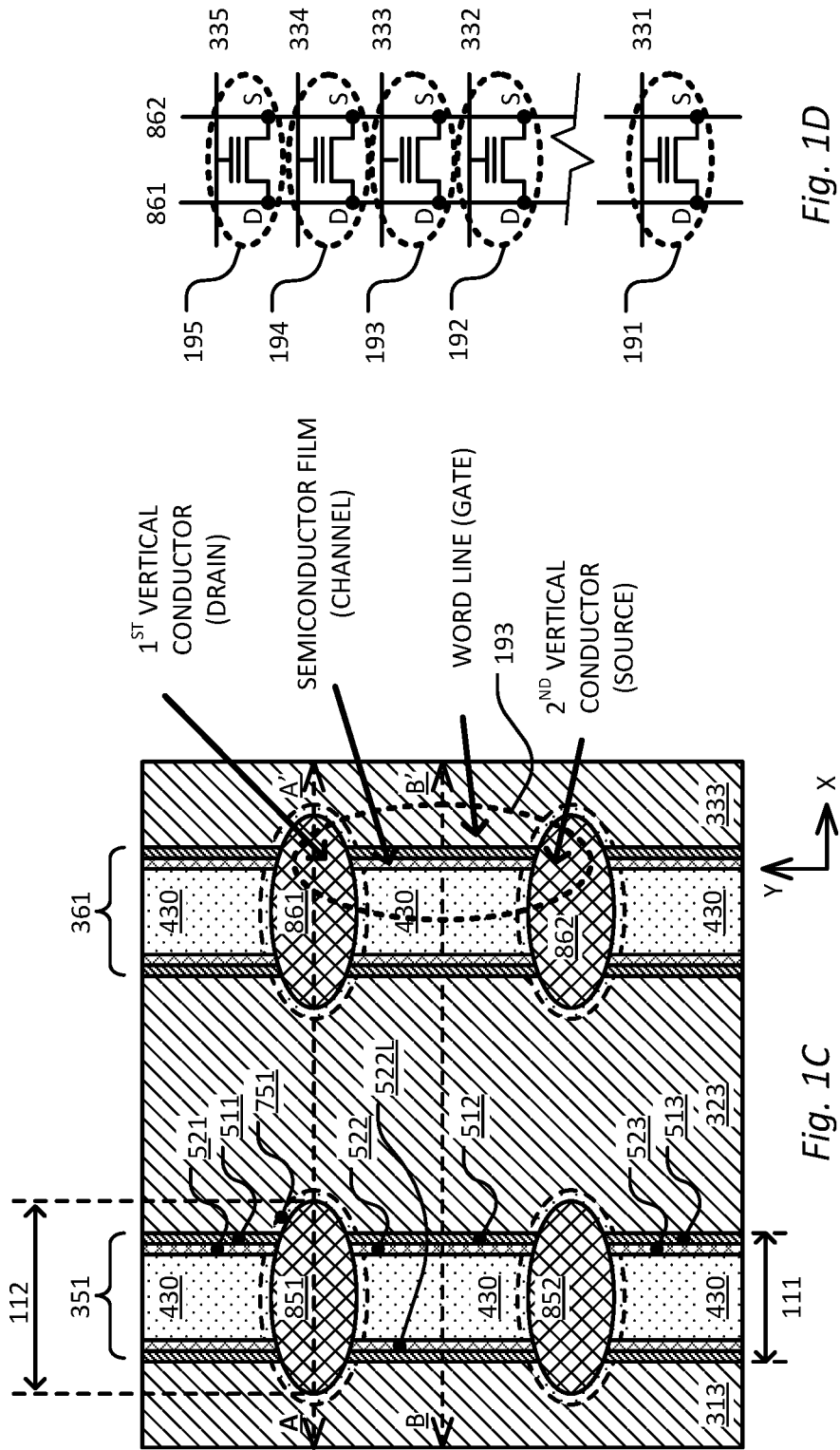

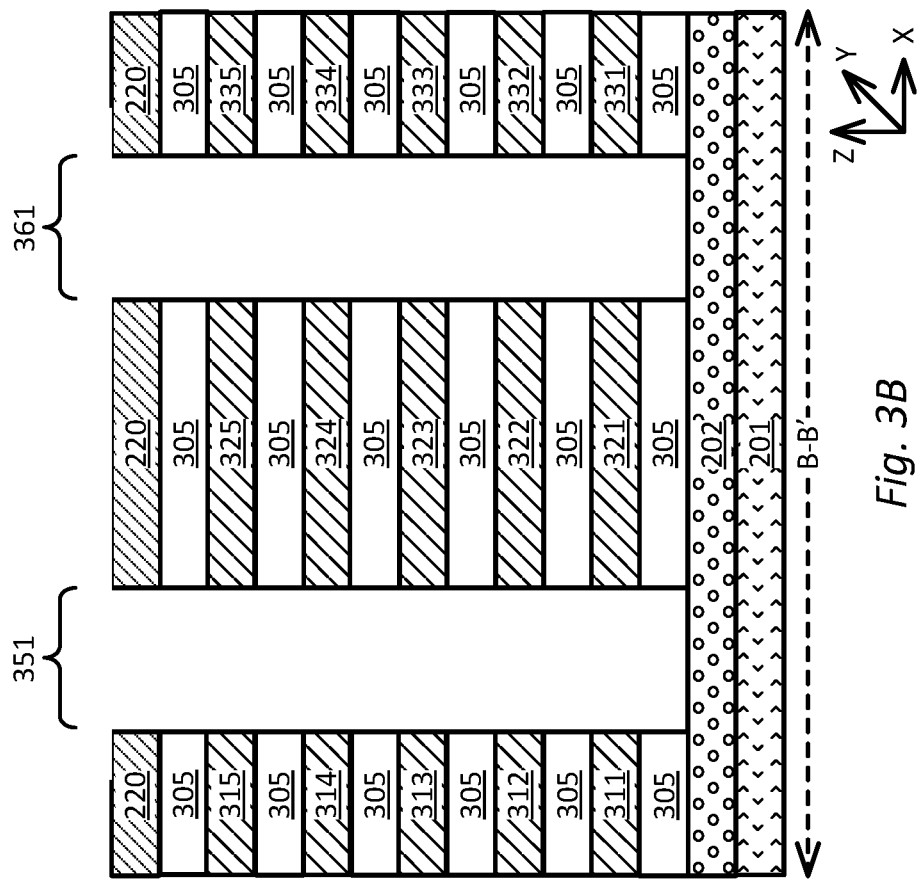
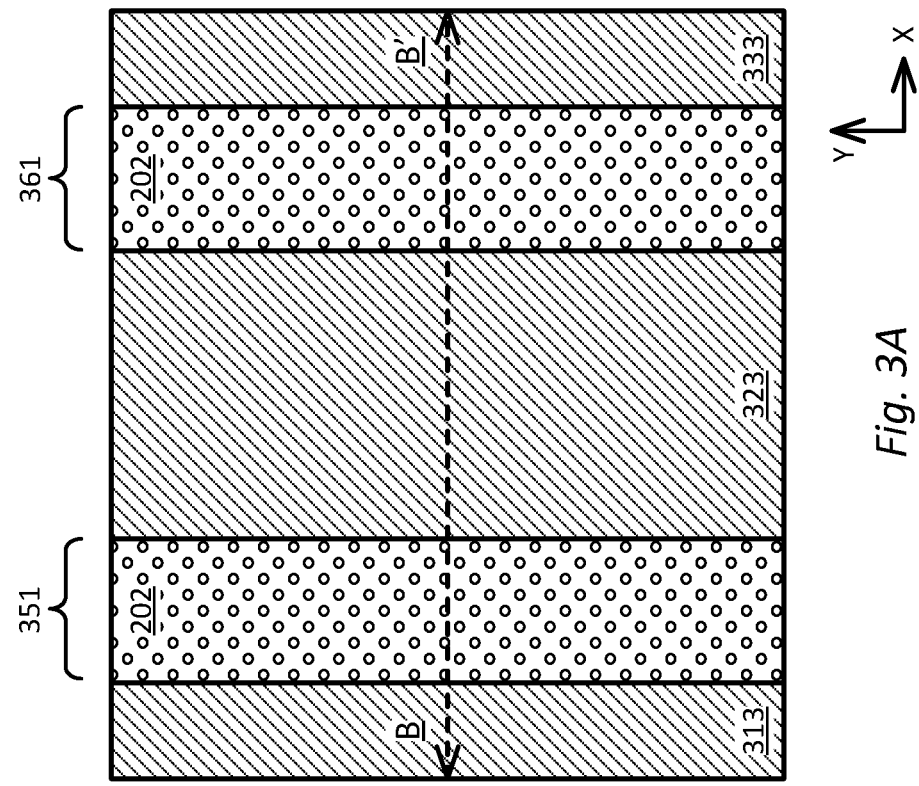
Fig. 3A
Fig. 3B

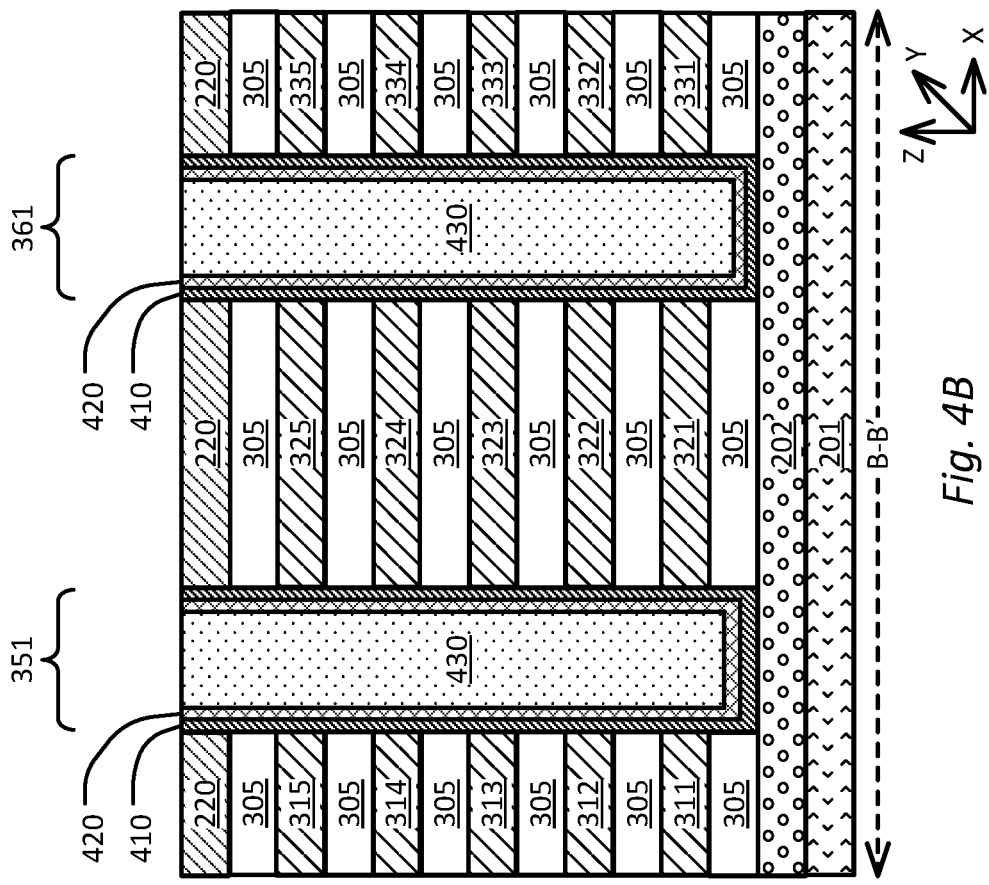
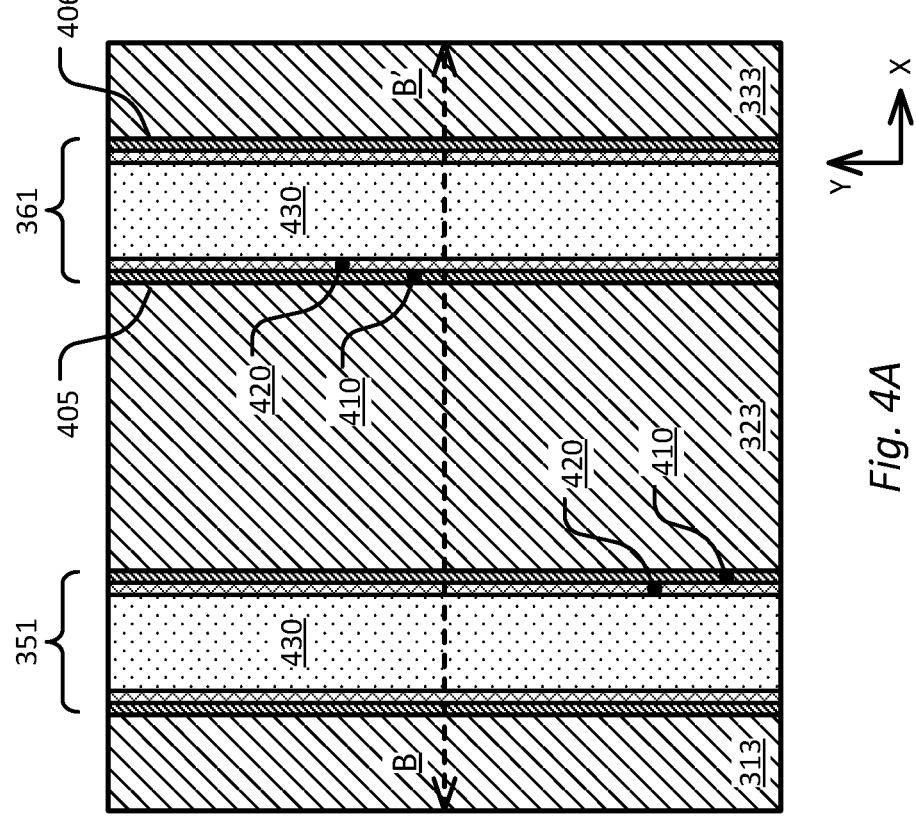
Fig. 4B
Fig. 4A

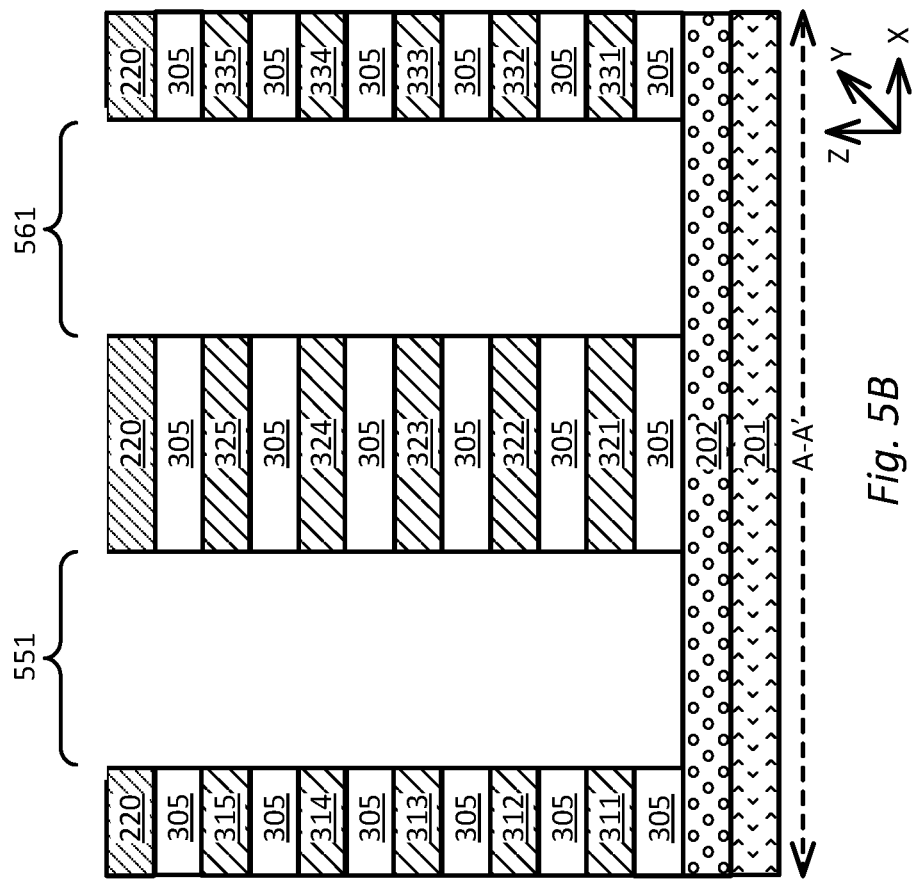
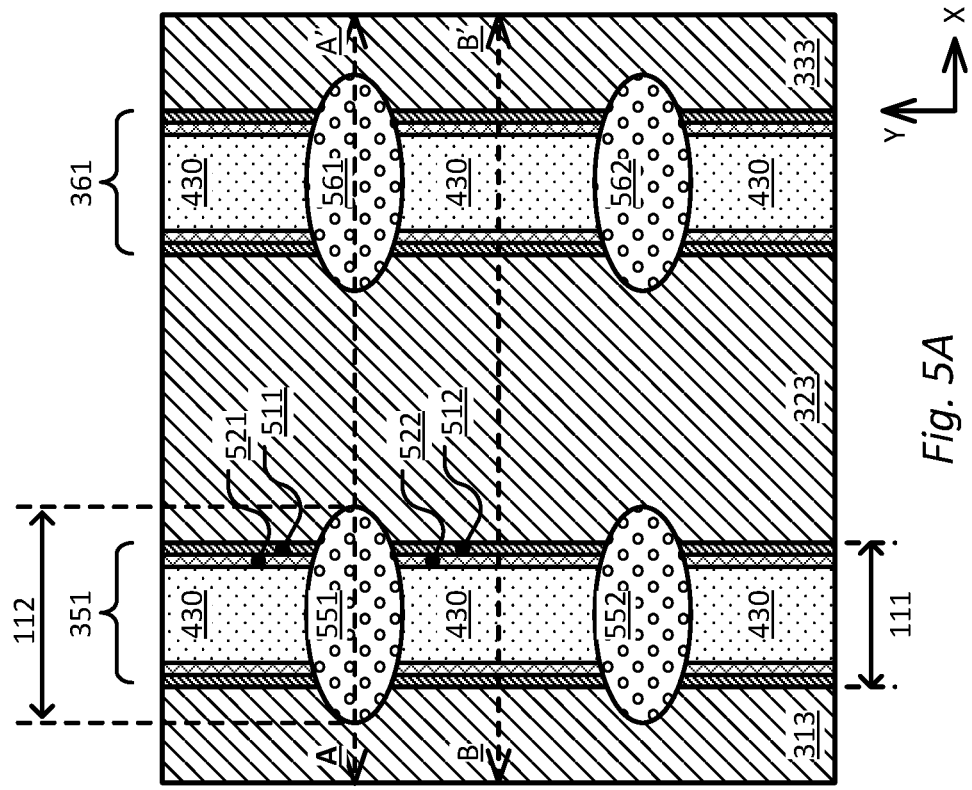
Fig. 5A
Fig. 5B

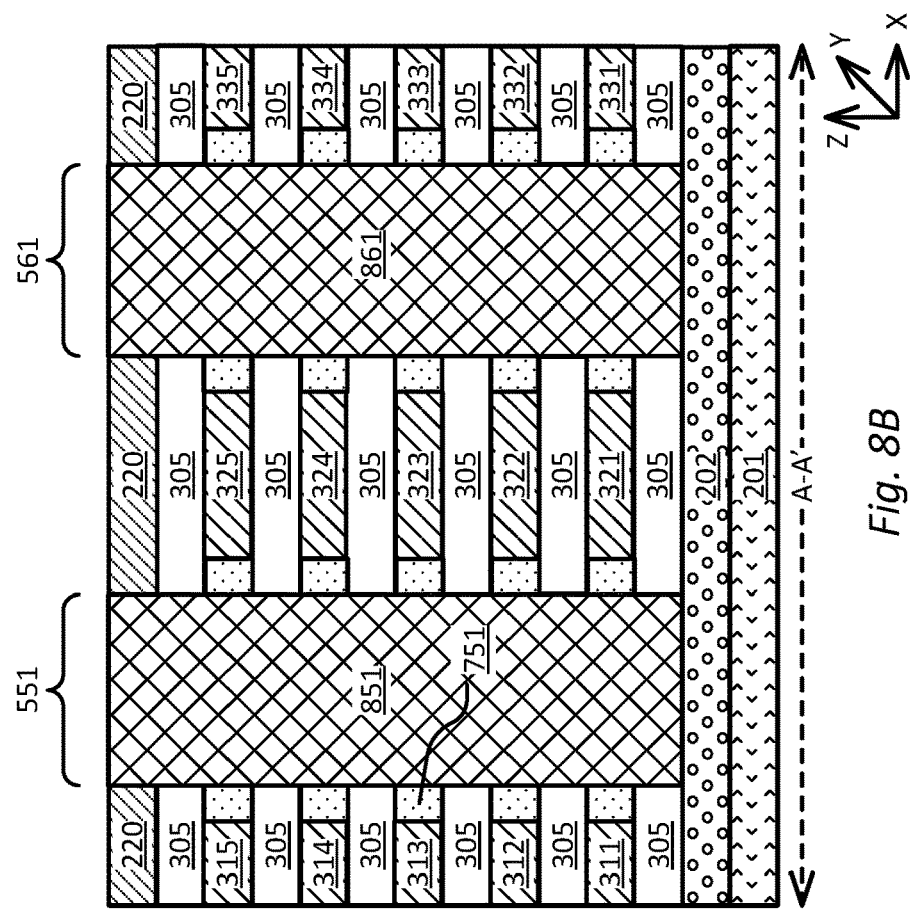
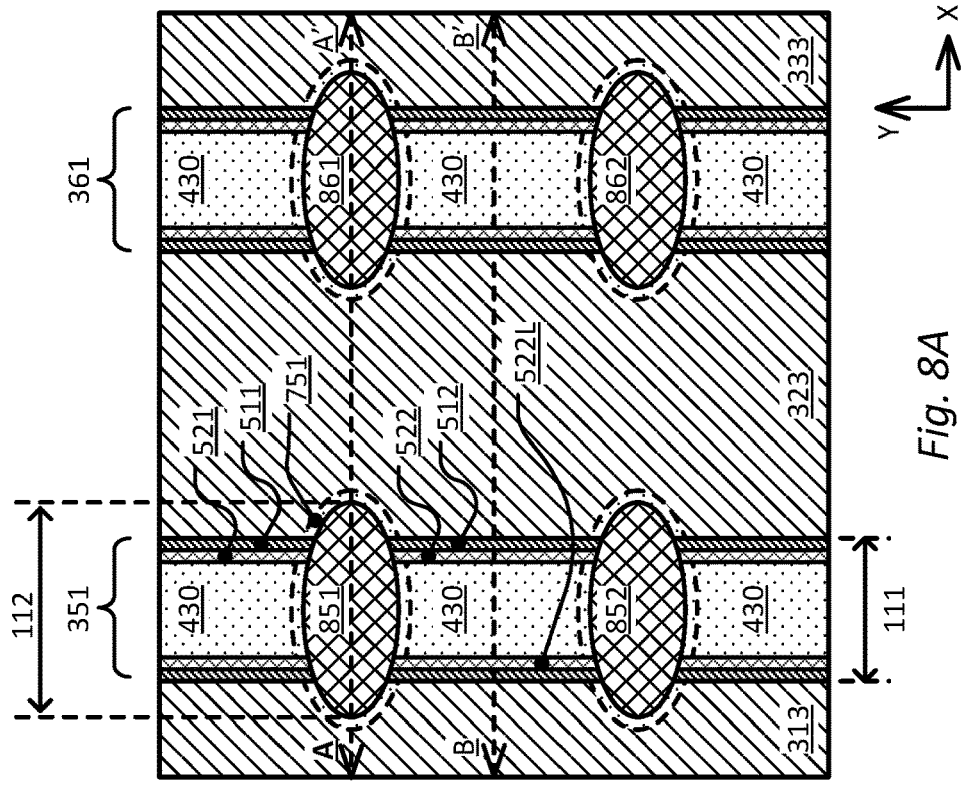
Fig. 8B
Fig. 8A

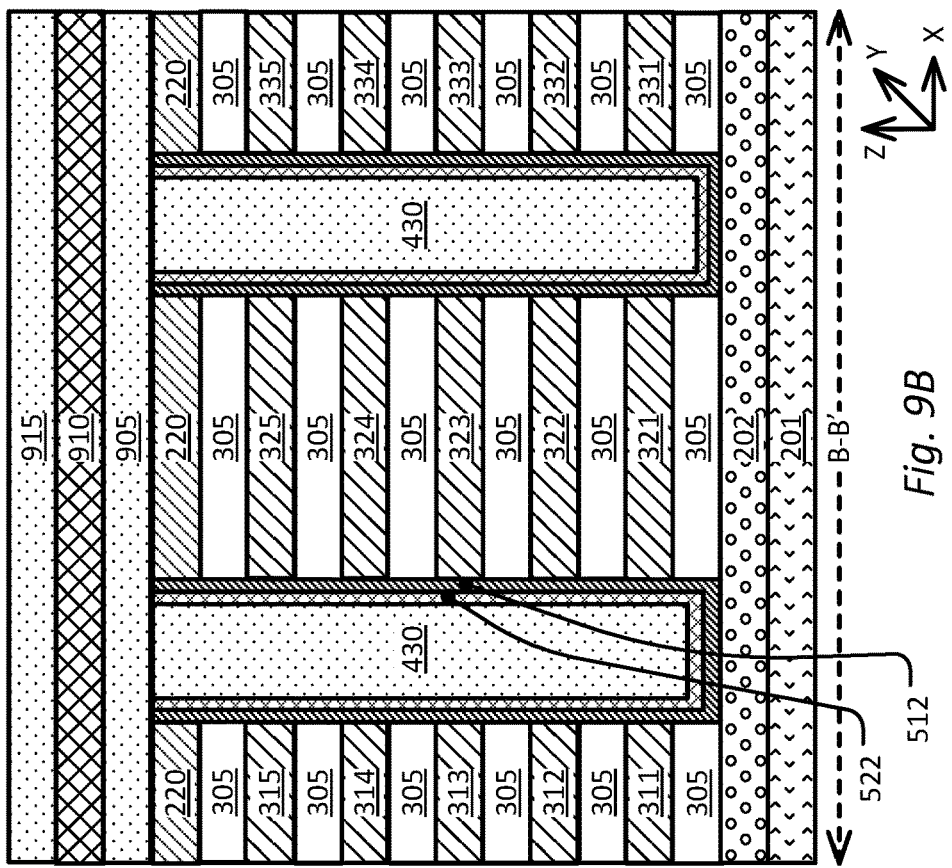
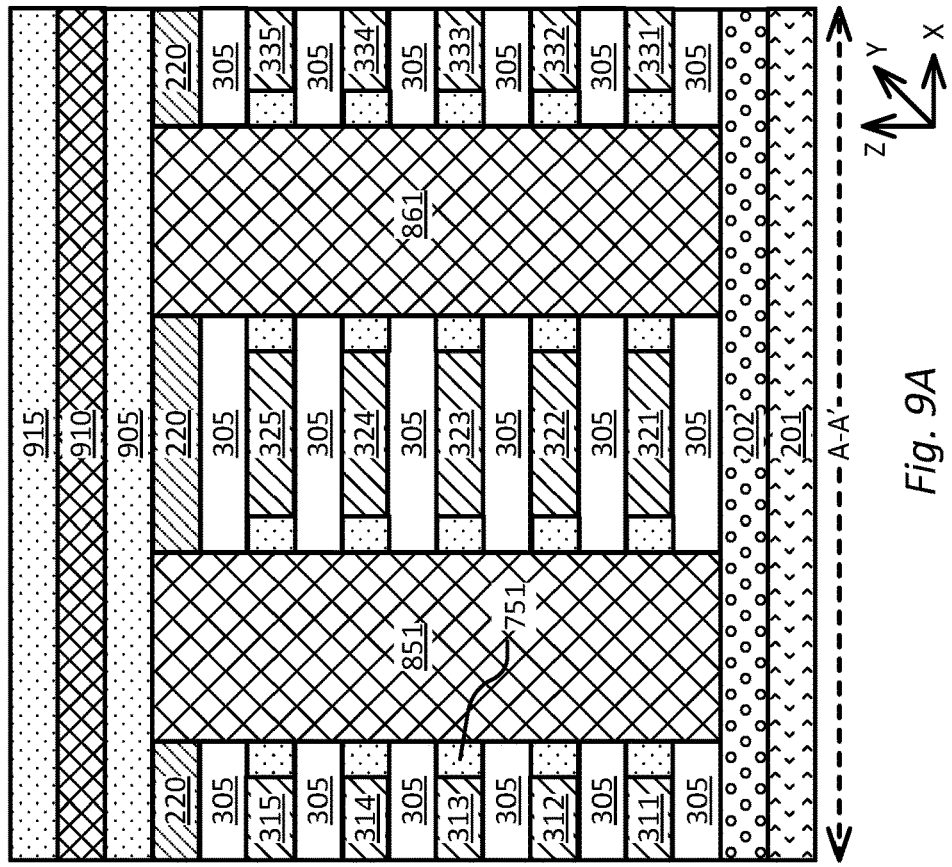
Fig. 9B
Fig. 9A

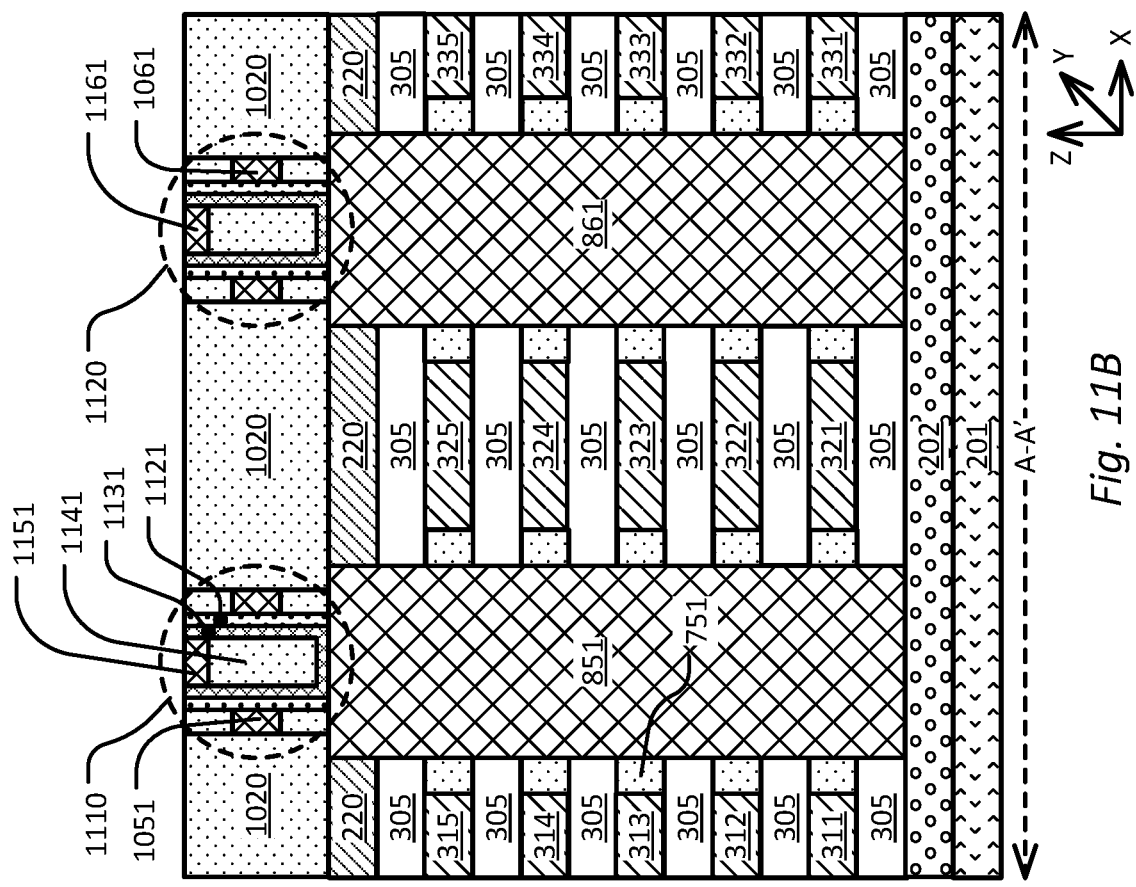
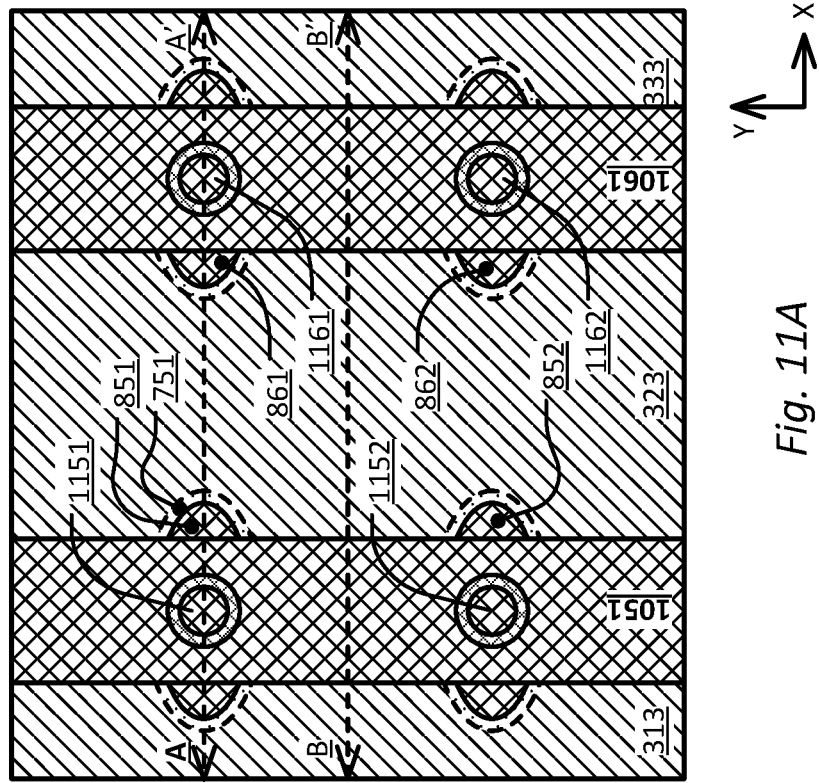
Fig. 11A
Fig. 11B

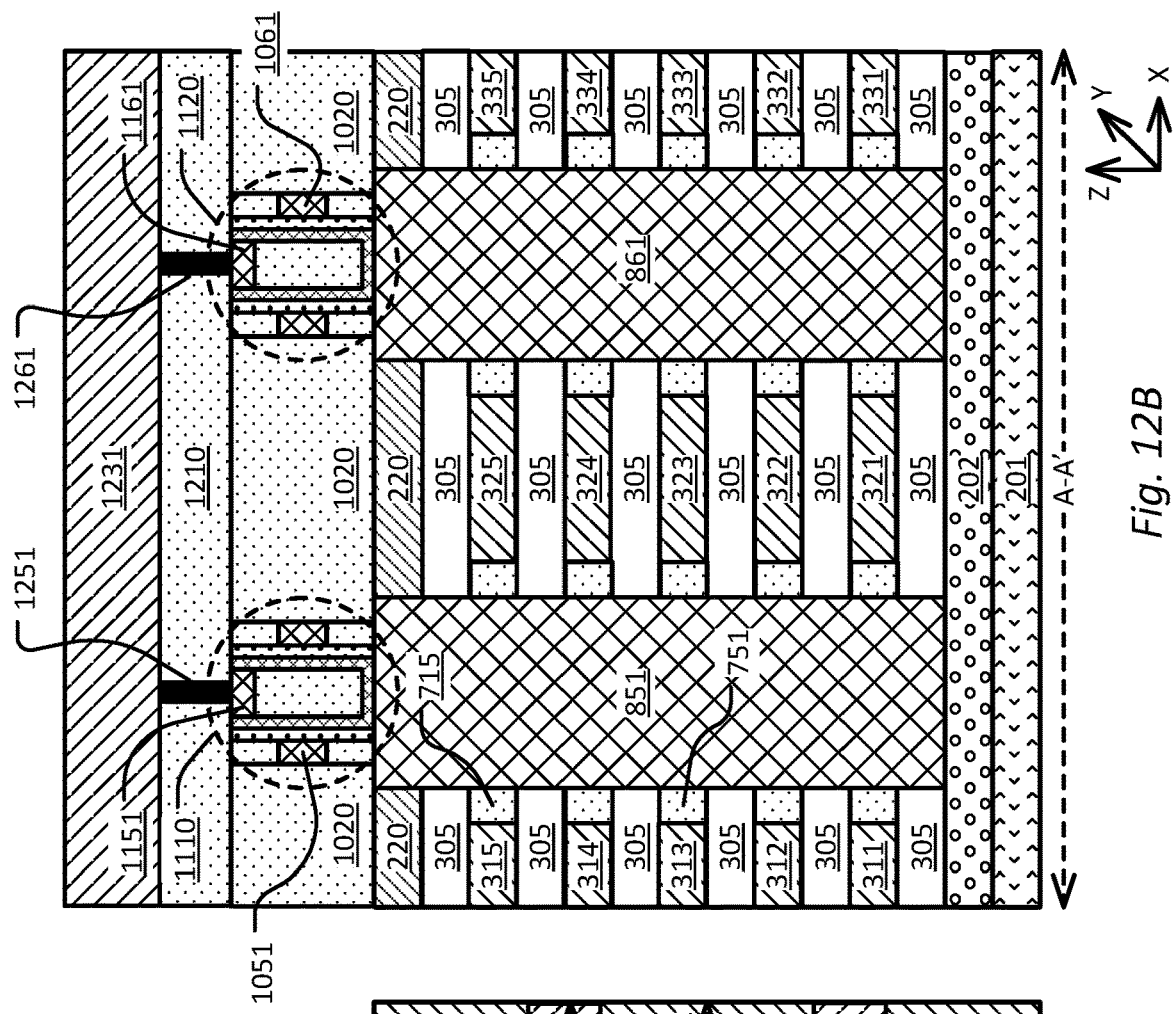
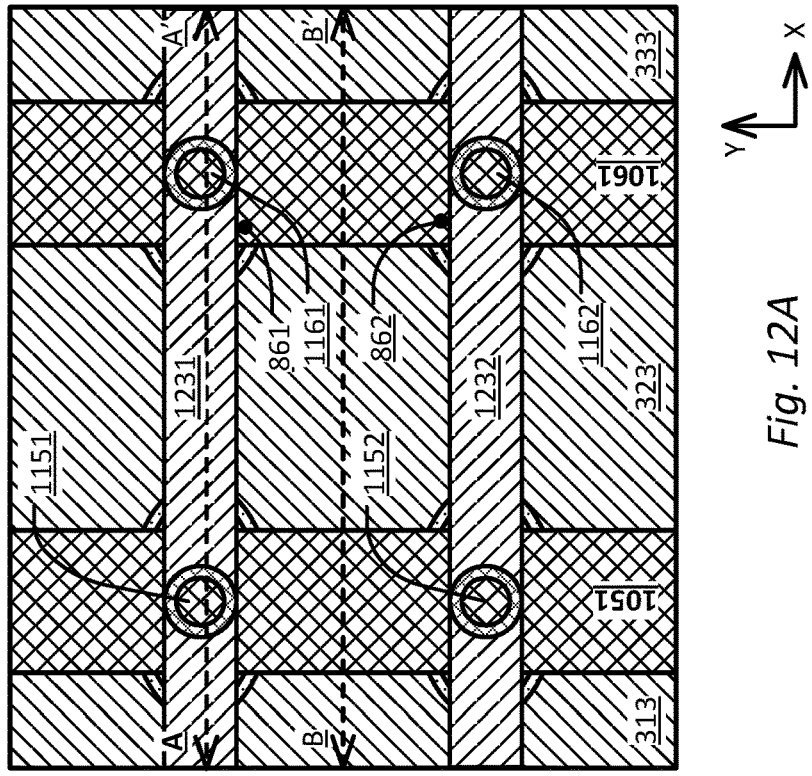
Fig. 12B
Fig. 12A

3D NOR MEMORY HAVING VERTICAL SOURCE AND DRAIN STRUCTURES

BACKGROUND

Field

The present invention relates to high density memory devices, and particularly to memory devices in which multiple planes of memory cells are arranged to provide a three-dimensional 3D array.

Description of Related Art

As critical dimensions of devices in integrated circuits shrink to the limits of common memory cell technologies, designers have been looking to techniques for stacking multiple planes of memory cells to achieve greater storage capacity, and to achieve lower costs per bit. For example, thin-film transistor techniques are applied to charge trapping memory technologies in Lai, et al., "A Multi-Layer Stackable Thin-Film Transistor (TFT) NAND-Type Flash Memory," IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node," IEEE Int'l Electron Devices Meeting, 11-13 Dec. 2006.

A planar NOR flash memory is a random access memory for high speed application but is limited in density. A three dimensionally stacked NAND flash memory has higher density than a planar NOR flash memory but is not a random access memory and has relatively lower operating speed.

It is desirable to provide technology for a three-dimensionally stacked integrated circuit memory having higher density, random access, and higher operating speed.

SUMMARY

A random access 3D NOR memory device having vertical source and drain structures is provided. A memory device comprises a plurality of stacks of word lines alternating with insulating strips, the stacks being separated by trenches, the word lines extending in a first direction. A plurality of vertical conductive structures, which can act as source/drain conductors, is disposed in the trenches between adjacent stacks. Between the vertical conductive structures, multilayer films of memory material and channel material are disposed on sidewalls of word lines on at least one side of the trenches, at least at the levels of the word lines. The channel material extends between, and makes ohmic contact with, adjacent vertical conductive structures. As used herein, ohmic contact is a low resistance junction providing current conduction between the channel material and the vertical conductive structures. At the locations along the word lines of the vertical source and drain structures, the sidewalls of the word lines are recessed between insulating strips in the stacks to form recesses on the sidewalls of the word lines to isolate the word lines from the vertical source and drain structures. Insulating material can be disposed in the recesses on the sidewalls of the word lines.

The structure results in formation of arrays of NOR cells on the sidewalls of the trenches, with vertical source/drain lines and horizontal word lines. Bit line select transistors (BLT) can be disposed at the top of the vertical source/drain lines.

The trenches can have a first width in a second direction orthogonal to the first direction, and the vertical conductive structures can have a second width in the second direction greater than the first width.

A particular vertical conductive structure can be in ohmic contact with a first film of channel material and a second film of channel material, the first and second films of channel material disposed opposite each other across the particular vertical conductive structure in the first direction.

The memory device can comprise a plurality of bit line transistors disposed over and connected to respective vertical conductive structures, and a plurality of bit lines disposed over and connected to respective rows of bit line transistors in the plurality of bit line transistors, the bit lines extending in a second direction orthogonal to the first direction. The memory device can comprise a plurality of gate lines disposed at a level of the bit line transistors and connected to respective columns of bit line transistors in the plurality of bit line transistors, the gate lines extending in the first direction. The bit line transistors can comprise channel films connected at lower ends to respective vertical conductive structures, the bit lines connected to the respective rows of bit line transistors via contacts to respective upper ends of the channel films.

The memory device can comprise circuitry connected to the bit lines to apply first and second voltages to the bit lines. In one embodiment, the first voltage can be a drain side voltage (e.g. VCC) and the second voltage can be a source side voltage (e.g. 0V). The circuitry can be configured to select a particular memory cell having a drain in a first vertical conductive structure, a source in a second vertical conductive structure, and a channel in a particular film of channel material in ohmic contact with the first and second vertical conductive structures and disposed on the sidewall of a particular word line.

To select a particular memory cell, the circuitry can be configured to turn on a first bit line transistor connected to the first vertical conductive structure and a second bit line transistor connected to the second vertical conductive structure. The first voltage can be applied to a first bit line connected to the first vertical conductive structure, the second voltage can be applied to a second bit line connected to the second vertical conductive structure, and a word line voltage can be applied to the particular word line.

In one embodiment, the insulating material on the sidewalls of word lines in the stacks can include dielectric material. In an alternative embodiment, the insulating material on the sidewalls of word lines in the stacks can include oxide of the word lines.

A method is also provided for manufacturing a memory device as described herein.

Other aspects and advantages of the present invention can be seen on review of the drawings, the detailed description and the claims, which follow.

BRIEF DESCRIPTION OF THE DRAWINGS

FIGS. 1A, 1B, 1C and 1D illustrate simplified diagrams of a memory device.

FIGS. 2, 3A, 3B, 4A, 4B, 5A, 5B, 6A, 6B, 7A, 7B, 8A, 8B, 9A, 9B, 10A, 10B, 11A, 11B, 12A and 12B illustrate stages of a simplified process flow for manufacturing a memory device.

FIG. 2 illustrates a stage in the process flow after forming a stack of conductive layers.

FIGS. 3A and 3B illustrate a stage in the process flow after forming a plurality of stacks of word lines.

FIGS. 4A and 4B illustrate a stage in the process flow after forming multi-layer films of memory material and channel material disposed on sidewalls of word lines.

FIGS. 5A, 5B, 5C, 6A, 6B, 7A, 7B, 8A and 8B illustrate stages in the process flow for forming vertical conductive structures disposed in the trenches between adjacent stacks of word lines.

FIGS. 5A, 5B and 5C illustrate a stage in the process flow after etching holes between the stacks of word lines through the multi-layer films of memory material and channel material.

FIGS. 6A and 6B illustrate a stage in the process flow after etching recesses on sidewalls of word lines in the stacks.

FIGS. 7A and 7B illustrate a stage in the process flow after forming insulating material in the recesses via the holes.

FIGS. 8A and 8B illustrate a stage in the process flow after forming a plurality of columns of vertical conductive structures disposed in the trenches.

FIGS. 9A, 9B, 10A, 10B, 11A, and 11B illustrate stages in the process flow for forming a plurality of bit line transistors disposed over and connected to respective vertical conductive structures.

FIGS. 12A and 12B illustrate a stage in the process flow after forming a plurality of bit lines disposed over and connected to respective rows of bit line transistors.

DETAILED DESCRIPTION

Figure 2:
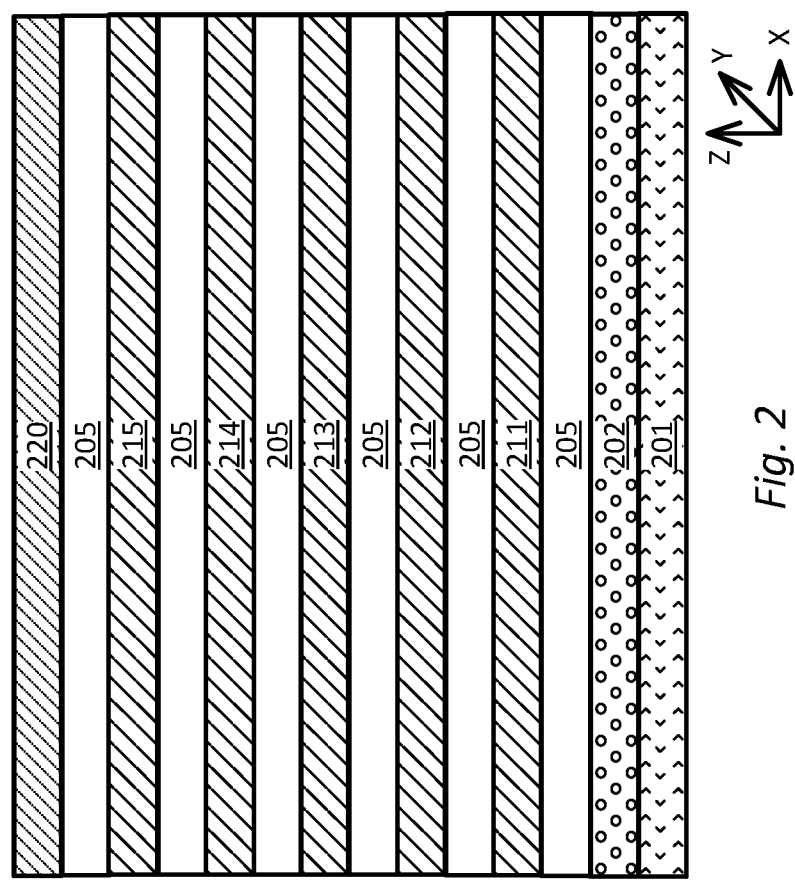

A detailed description of embodiments of the present invention is provided with reference to the Figures. It is to be understood that there is no intention to limit the technology to the specifically disclosed structural embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows. Like elements in various embodiments are commonly referred to with like reference numerals.

FIGS. 1A, 1B, 1C and 1D illustrate simplified diagrams of a memory device. FIG. 1A is a simplified vertical cross-sectional diagram of a memory device 100, taken along a line A-A' as shown in FIG. 1C. As shown in the example of FIG. 1A, the memory device 100 comprises a plurality of stacks of word lines (311-315, 321-325, 331-335) alternating with insulating strips 305. The stacks can be disposed over an insulating layer 202 on a substrate 201. The stacks are separated by trenches (351, 361, FIG. 1C). The word lines extend in a first direction (Y-direction) orthogonal to an X-Z plane. A hard mask 220 can be disposed on top of the stacks of word lines.

A plurality of columns of vertical conductive structures can be disposed in the trenches between adjacent stacks. For example, a first vertical conductive structure 851 can be disposed between a first stack including word lines 311-315 and a second stack including word lines 321-325. Similarly, a second vertical conductive structure 861 can be disposed between the second stack including word lines 321-325 and a third stack including word lines 331-335.

In one embodiment, the conductive material filling the holes can include N+ polysilicon. Other embodiments can include metals, metal nitrides, other metal compounds or combinations of metals and metal compounds, such as platinum, tantalum nitride, metal silicides, aluminum or other metal or metal compound gate materials (e.g. from Ti, TiN, Ta, Ru, Ir, $RuO_2$, $IrO_2$, W, WN), and others. For some applications, it is preferable to use materials having work functions higher than 4 eV, preferably higher than 4.5 eV.

Insulating material 751 can be disposed in recesses on sidewalls of word lines in the stacks between the word lines (313, 323) and the vertical conductive structures 851, where the word lines are recessed relative to the vertical conductive structures.

FIG. 1B is a simplified vertical cross-sectional diagram of the memory device 100, taken along a line B-B' as shown in FIG. 1C. As shown in the example of FIG. 1B, the channel material 522 is disposed on the sidewalls of the stacks, and the memory material 512 is disposed between the channel material and the stacks. The trenches (351, 352, FIG. 1C) can be filled with insulating material 430 over the channel material 522.

The channel material can include undoped polysilicon or P type doped polysilicon. The memory material 512 can include multilayer dielectric charge trapping structures known from flash memory technologies as ONO (oxide-nitride-oxide), ONONO (oxide-nitride-oxide-nitride-oxide), ONONONO (oxide-nitride-oxide-nitride-oxide-nitride-oxide), SONOS (silicon-oxide-nitride-oxide-silicon), BE-SONOS (bandgap engineered silicon-oxide-nitride-oxide-silicon), TANOS (tantalum nitride, aluminum oxide, silicon nitride, silicon oxide, silicon), and MA BE-SONOS (metal-high-k bandgap-engineered silicon-oxide-nitride-oxide-silicon), or other charge trapping layers or combinations of those layers.

FIG. 1C is a simplified horizontal cross-sectional diagram of the memory device 100, taken at a level of the word lines 313, 323 and 333 as shown in FIGS. 1A and 1B. As shown in the example of FIG. 1C, a memory cell 193 has a drain in a first vertical conductive structure 861, a source in a second vertical conductive structure 862, and a channel in a semiconductor film of channel material in ohmic contact with the first and second vertical conductive structures and disposed on the sidewall of a word line 333.

As shown in the example of FIG. 1C, films of channel material (e.g. 521, 522) are disposed on the sidewalls of the stacks between adjacent vertical conductive structures (851, 852) in the first direction. Films of channel material (e.g. 521) in a particular trench (351) on one side of a particular vertical conductive structures (851) in the particular trench is not continuous to films of channel material (e.g. 522) on an opposite side of the particular vertical conductive structures in the particular trench.

FIG. 1D is a simplified schematic diagram of a vertical string of memory cells (191-195), including a memory cell 193 as shown in FIG. 1C. As shown in the example of FIG. 1D, memory cells in the vertical string of memory cells have a drain D in a first vertical conductive structure 861, and a source S in a second vertical conductive structure 862. Each memory cell in the vertical string of memory cells has a channel in ohmic contact with the first and second vertical conductive structures. Memory cells (191-195) in the vertical string of memory cells have gates connected to respective word lines (331-335).

A particular film of channel material 522 is in ohmic contact with a first vertical conductive structure 851 and a second vertical conductive structure 852. A second particular film of channel material 522L is in contact with the first vertical conductive structure 851 and the second vertical conductive structure 852. The first and second vertical conductive structures are disposed on opposite sidewalls of stacks of word lines (313, 323) across a trench 351.

The trenches can have a first width 111 in the second direction (X-direction) orthogonal to the first direction (Y-direction). The vertical conductive structures can have a second width 112 in the second direction greater than the first width.

As shown in the example of FIG. 1C, a particular vertical conductive structure 851 is in ohmic contact with a first film of channel material 521 and a second film of channel material 522, where the first and second films of channel material are disposed opposite each other across the particular vertical conductive structure 851 in the first direction.

As shown in the example of FIG. 1A, the memory device 100 can include a plurality of bit line transistors (1110, 1120) disposed over and connected to respective vertical conductive structures (851, 861). The memory device 100 can include a plurality of bit lines 1231 disposed over and connected to respective rows of bit line transistors (1110, 1120) in the plurality of bit line transistors, where the bit lines extend in the second direction (X-direction). A plurality of gate lines (1051, 1061, 1071, 1081, FIGS. 1A, 1B and 14) is disposed at a level of the bit line transistors and connected to respective columns of bit line transistors in the plurality of bit line transistors, the gate lines extending in the first direction.

The bit line transistors (1110, 1120) can comprise channel films connected at lower ends to respective vertical conductive structures (851, 861). The bit lines 1231 are connected to the respective rows of bit line transistors (1110, 1120) via contacts (1251, 1261) to respective upper ends of the channel films. Landing pads (1151, 1161) can be disposed at upper ends of the channel films and in contact with the channel films, and contacts (1251, 1261) can be disposed over and in contact with the landing pads. The bit line transistors and bit lines are further described in reference to FIGS. 12A, 12B and 14.

Figure 13:
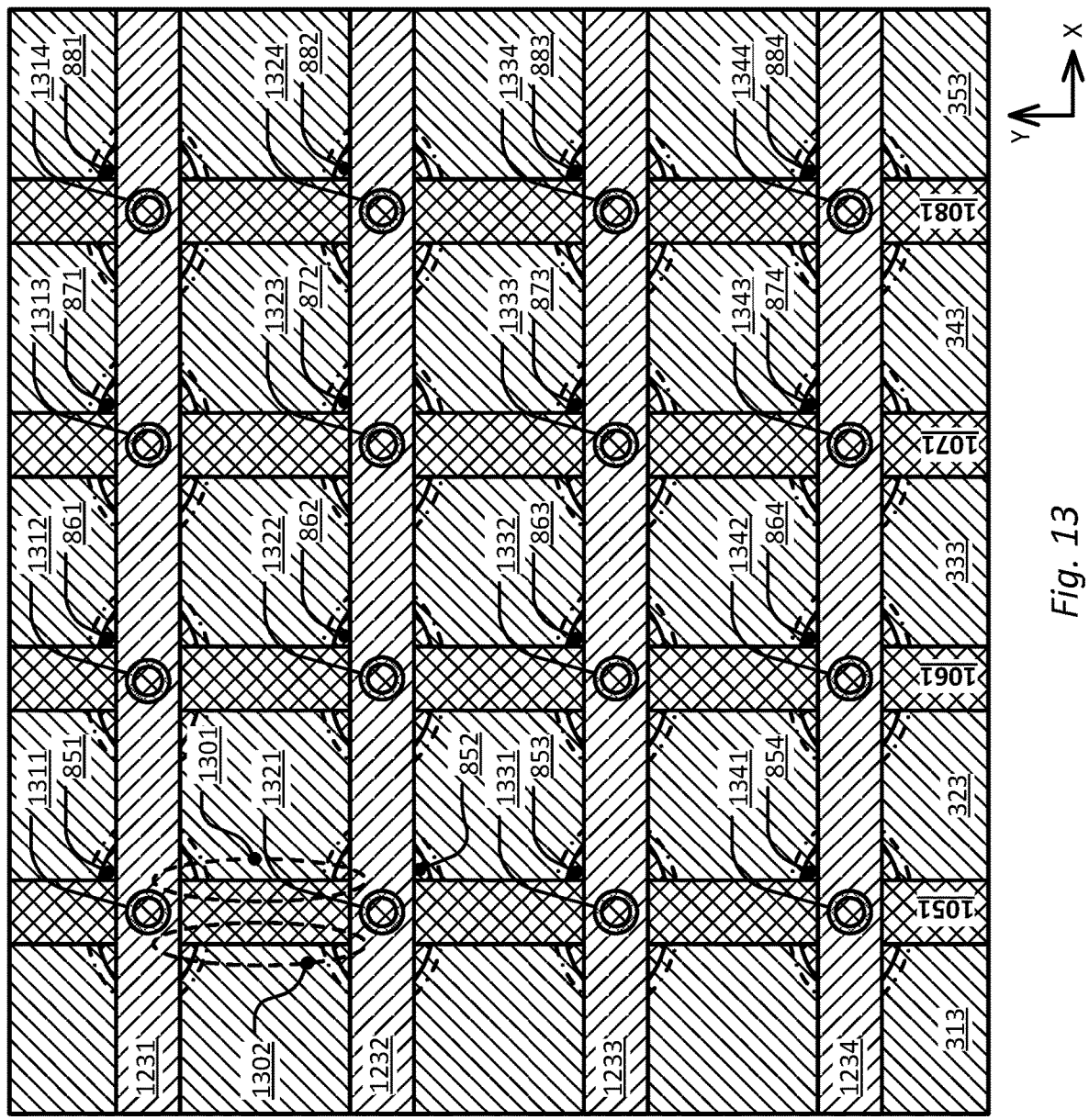
FIG. 13 is a diagram illustrating selection of a memory cell from a NOR array of memory cells.

Although not shown in FIGS. 1A, 1B, 1C and 1D, the memory device comprises circuitry (1652, FIG. 16) connected to the bit lines in the stacks to apply first and second voltages to the bit lines, as described in reference to FIG. 13. In one embodiment, the first voltage can be a drain side voltage (e.g. VCC) and the second voltage can be a source side voltage (e.g. 0V).

FIGS. 2, 3A, 3B, 4A, 4B, 5A, 5B, 5C, 6A, 6B, 7A, 7B, 8A, 8B, 9A, 9B, 10A, 10B, 11A, 11B, 12A and 12B illustrate stages of a simplified process flow for manufacturing a memory device.

FIG. 2 illustrates a stage in the process flow after forming a stack of conductive layers 211-215 alternating with insulating layers 205 over an insulating layer 202 on a substrate 201. In one embodiment, the conductive layers can include N+ polysilicon. A hard mask 220 can be formed on top of the stack of conductive layers.

FIGS. 3A and 3B illustrate a stage in the process flow after forming a plurality of stacks of word lines. The stage can include line patterning the hard mask and then etching a stack of conductive layers 211-215 (FIG. 2) using the patterned hard mask, stopping on the insulating layer 202, to form a plurality of stacks of word lines (311-315, 321-325, 331-335) alternating with insulating strips 305. The stacks of word lines are separated by trenches (351, 361) through the conductive layers to the insulating layer 202. In this example, the word lines extend in a first direction (Y-direction).

FIG. 3A is a top view of an example structure at this process stage, illustrating word lines 313, 323 and 333 and trenches (351, 361) through the stack of conductive layers to expose the insulating layer 202. FIG. 3B is a vertical cross-section view of the example structure taken along a line B-B' as shown in FIG. 3A, where the line B-B' extends in a second direction (X-direction) orthogonal to the first direction. FIG. 3B illustrates stacks of word lines (311-315, 321-325, 331-335) alternating with insulating strips 305, and trenches (351, 361) vertically extending from a hard mask 220 through the stack of conductive layers to the insulating layer 202.

FIGS. 4A and 4B illustrate a stage in the process flow after forming multi-layer films of memory material and channel material disposed on sidewalls of word lines. The stage can include depositing the memory material 410 on sidewalls (405, 406) of the stacks of word lines (e.g. 323, 333), and depositing the channel material 420 over the memory material 410 on sidewalls of the stacks of word lines. The trenches (351, 352) can be filled with insulating material 430 over the channel material 420. A chemical mechanical planarization CMP process can then be applied over the structure, stopping at the hard mask 220 on top of the stacks of word lines.

FIG. 4A is a top view of the example structure at this process stage, illustrating the memory material 410 on sidewalls (405, 406) of the stacks of word lines, and the channel material 420 over the memory material 410 on sidewalls of the stacks. FIG. 4B is a vertical cross-section view of the example structure taken along a line B-B' as shown in FIG. 4A.

FIG. 4B illustrates the memory material 410 on sidewalls of the stacks, and the channel material 420 over the memory material on sidewalls of the stacks, and insulating material 430 filling the trenches (351, 352) over the channel material 420. The memory material 410 and the channel material 420 are continuous on the sidewalls of the adjacent stacks and on the bottom surface of the trench 351/361, which is on the top surface of the insulating layer 202. The memory material 410 and the channel material 420 are continuous from the sidewalls of the adjacent stacks to the bottom surface of the trench 351/361.

Adjacent stacks of word lines (311-315, 321-325, 331-335) can be physically or electrically separated from each other, for example by the insulating material 430 in the trenches, so the adjacent stacks of word lines can be operated independently. For instance, a first stack of word lines 311-315 is physically separated from a second stack of word lines 321-325, which is physically separated from a third stack of word lines 331-335. Sidewalls of adjacent stacks of word lines are physically separated from each other. For instance, sidewall 405 on a second stack of word lines 321-325 are physically separated from sidewall 406 on an adjacent third stack of word lines 331-335.

The channel material 420 can include undoped polysilicon or P type doped polysilicon. The memory material 410 can include multilayer dielectric charge trapping structures known from flash memory technologies as ONO (oxide-nitride-oxide), ONONO (oxide-nitride-oxide-nitride-oxide), ONONONO (oxide-nitride-oxide-nitride-oxide-nitride-oxide), SONOS (silicon-oxide-nitride-oxide-silicon), BE-SONOS (bandgap engineered silicon-oxide-nitride-oxide-silicon), TANOS (tantalum nitride, aluminum oxide, silicon nitride, silicon oxide, silicon), and MA BE-SONOS (metal-high-k bandgap-engineered silicon-oxide-nitride-oxide-silicon), or other charge trapping layers or combinations of those layers.

FIGS. 5A, 5B, 5C, 6A, 6B, 7A, 7B, 8A and 8B illustrate stages in the process flow for forming vertical conductive structures (e.g. 851, 861, FIGS. 8A, 8B) disposed in the trenches between adjacent stacks of word lines.

Figure 5C:
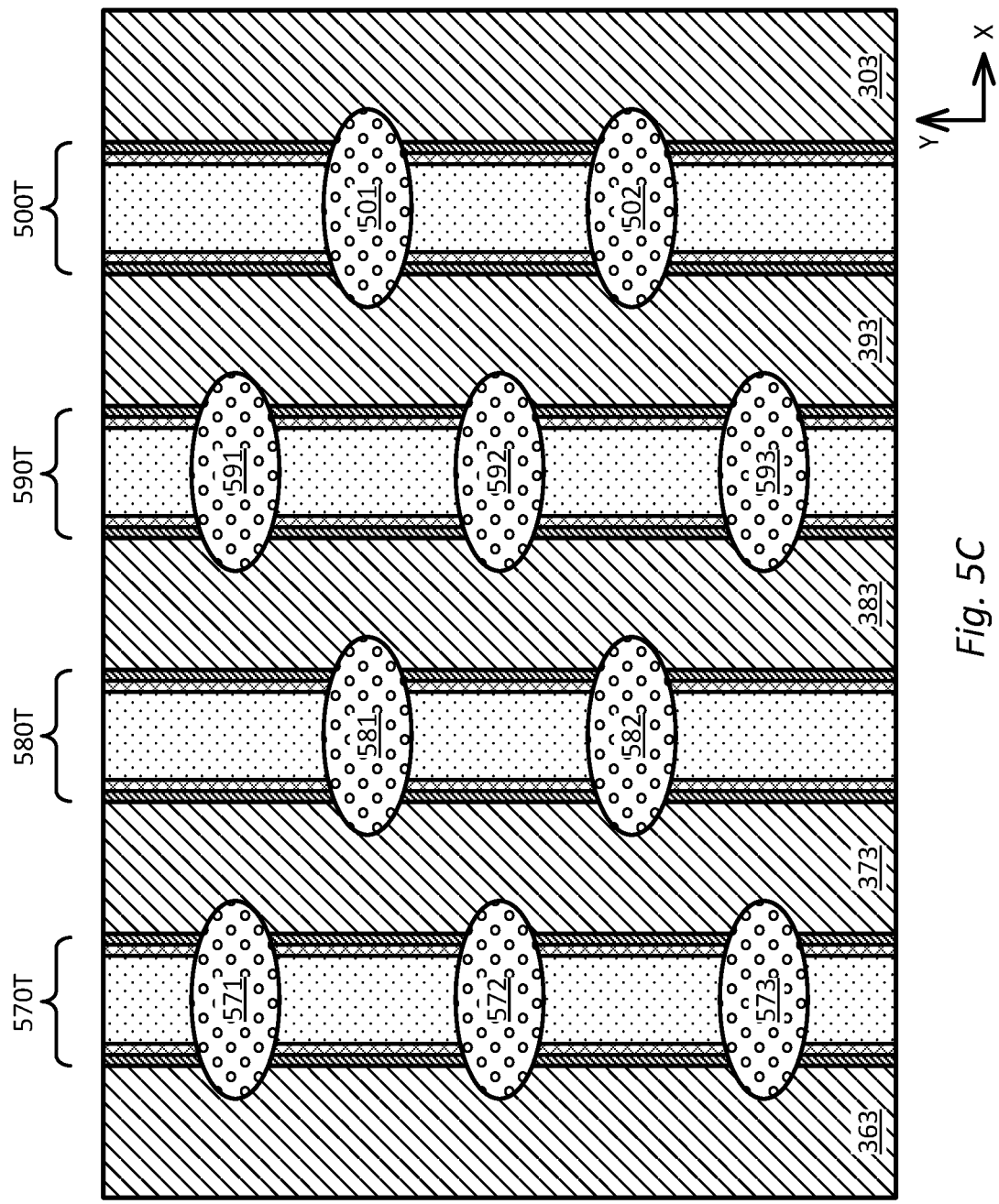

FIGS. 5A, 5B and 5C illustrate a stage in the process flow after etching holes (551-552, 561-562) between the stacks of word lines through the multi-layer films of memory material and channel material (410, 420, FIGS. 4A, 4B) on the sidewalls of the stacks, through the sidewalls (405, 406) of the word lines, and through the insulating material 430 in the trenches (351, 361). FIG. 5A is a top view of the structure at this stage. FIG. 5B is a vertical cross sectional view of the structure through a row of holes (551, 561), taken at a line A-A' that extends in the second direction (X-direction) as shown in FIG. 5A. This etch step can stop on the insulating layer (202, FIG. 5B) on top of the stacks of word lines. The trenches (351, 361) can have a first width 111 in the second direction (X-direction). The holes can have a second width 112 in the second direction greater than the first width.

The holes can separate the channel material (420, FIG. 4A, 4B) into a first film of channel materials (521) and a second film of channel material (522), where the first and second films of channel materials are disposed opposite each other across a particular hole (551) in the first direction. The holes can separate the memory material (410, FIG. 4A, 4B) into a first film of memory material (511) and a second film of memory material (512), where the first and second films of memory material are disposed opposite each other across a particular hole (551) in the first direction.

FIG. 5C illustrates an alternative layout of holes, where the holes (571-573, 581-582, 591-593, 501-502) can be laid out in a honeycomb arrangement, so that density of an array of memory cells can be increased. FIG. 5C illustrates word lines 363, 373, 383, 393, 303 and trenches 570T, 580T, 590T and 500T through the stack of conductive layers. Holes (571-573, 581-582, 591-593, 501-502) are etched between the stacks of word lines through the multi-layer films of memory material and channel material (410, 420, FIGS. 4A, 4B) on the sidewalls of the stacks, through the sidewalls (405, 406, FIG. 4A) of the word lines, and through the insulating material (430, FIG. 4A) in the trenches. The holes (571-573, 581-582, 591-593, 501-502) are laid out in a honeycomb arrangement in this example.

Figures 6A, 6B:
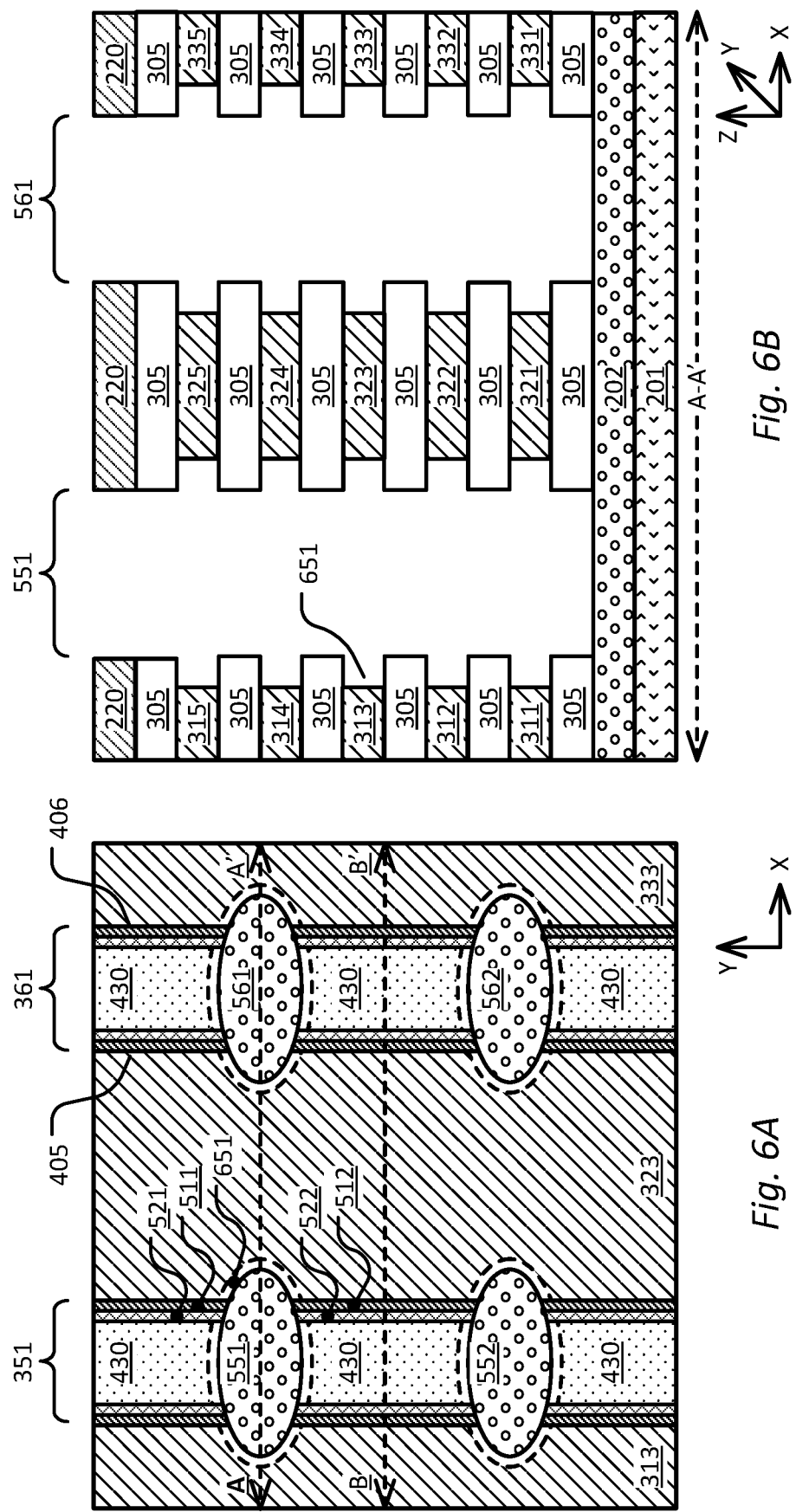

FIGS. 6A and 6B illustrate a stage in the process flow after etching recesses (651) on sidewalls of word lines (313, 323, 333) in the stacks via the holes (551, 561). The recesses are disposed between vertically adjacent insulating strips (305) in the stacks. FIG. 6A is a top view of the structure at this stage. Recesses 651 are shown in FIG. 6A with dash lines to indicate that recesses 651 are not visible in a top view. FIG. 6B is a vertical cross sectional view of the structure through a row of holes (551, 561), taken at the line A-A' as shown in FIG. 6A. In one embodiment, this etch step can use a selective etch process with a cleaning solution such as SC1 or NH4OH solution as known in the art. Here SC1 refers to a Standard Clean-1 procedure using for example a cleaning solution $H_2O_2$—$NH_4OH$—$H_2O$. $NH_4OH$ or SC1 can etch the word lines (311-315, 321-325, 331-335) including N+ polysilicon much faster than the films of channel material 521, 522.

Figure 7A:
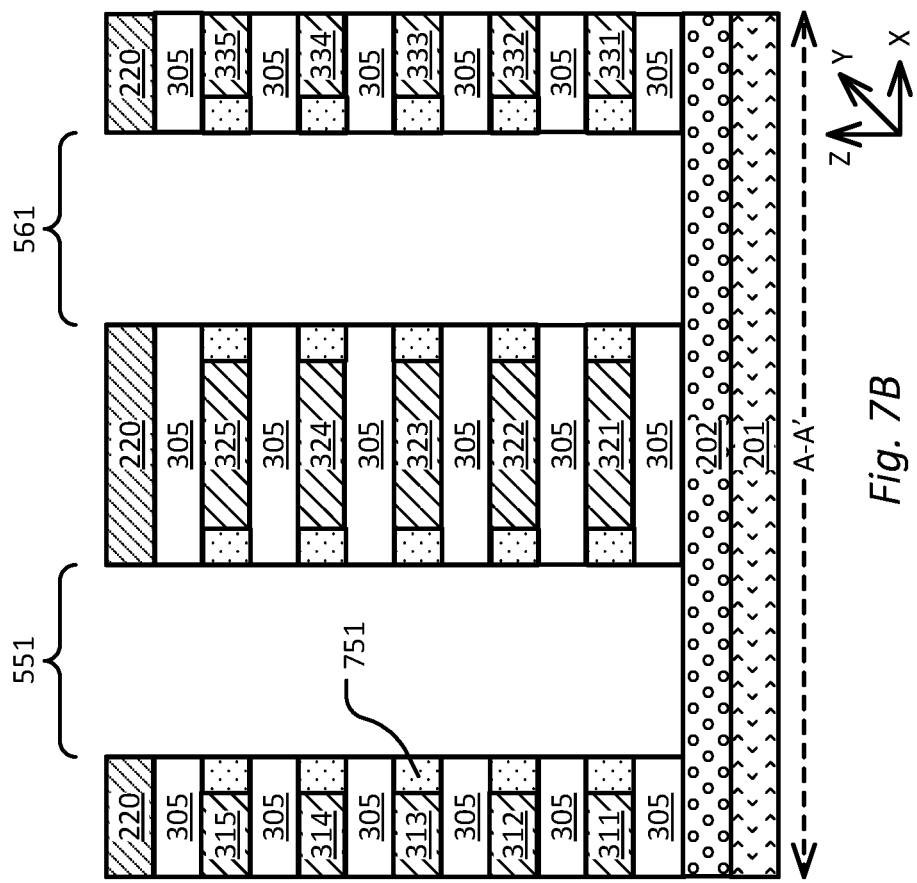
Figure 7B:
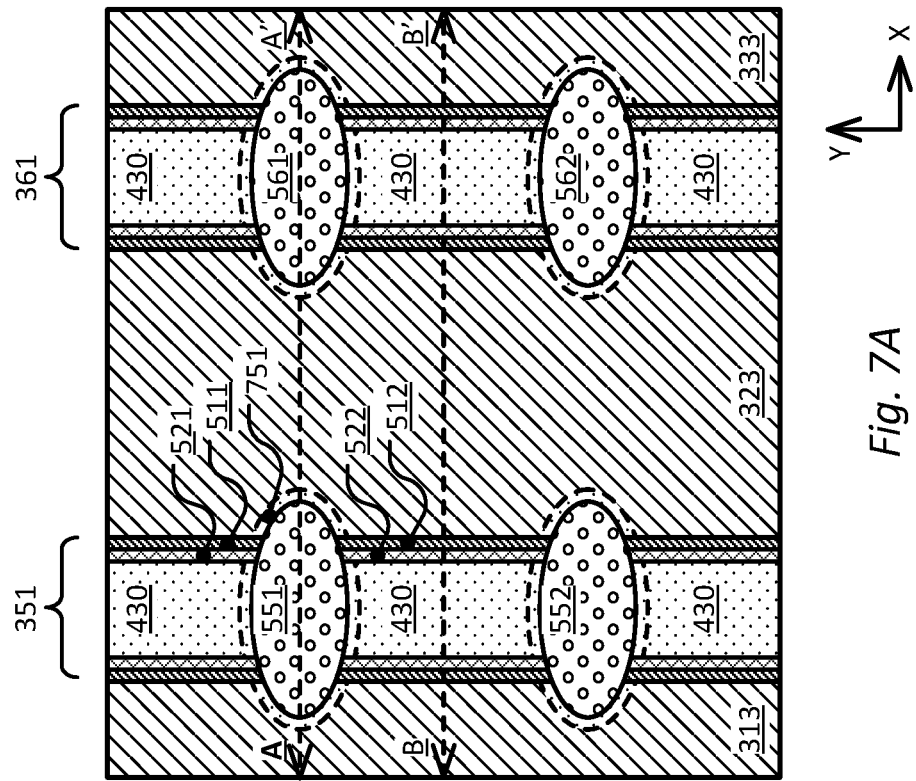

FIGS. 7A and 7B illustrate a stage in the process flow after forming insulating material (751) in the recesses (651, FIG. 6) on the sidewalls of word lines in the stacks via the holes (551, 561). FIG. 7A is a top view of the structure at this stage. Insulating material 751 is shown in FIG. 7A with dash lines to indicate that insulating material 751 is not visible in a top view. FIG. 7B is a vertical cross sectional view of the structure through a row of holes (551, 561), taken at the line A-A' as shown in FIG. 7A. In one embodiment, this step can use conformal dielectric deposition. When forming the insulating material 751 in the recesses, the insulating material 751 may be deposited on the channel material via the holes. For instance, the insulating material 751 may be formed on the first and second films of channel material (521, 522) via a particular hole (551). After the insulating material 751 is formed in the recesses, an isotropical etch can be applied to expose the films of channel material via the holes, so the films of channel material can connect to vertical conductive structures at a later stage described in reference to FIGS. 8A and 8B.

FIGS. 8A and 8B illustrate a stage in the process flow after forming a plurality of columns of vertical conductive structures disposed in the trenches between adjacent stacks of word lines. The stage can include filling the holes (551, 561, FIGS. 7A, 7B) with conductive material, thereby forming a plurality of columns of vertical conductive structures (851-852, 861-862) disposed in the trenches (351, 361) between adjacent stacks (313, 323, 333). FIG. 8A is a top view of the structure at this stage. FIG. 8B is a vertical cross sectional view of the structure through a row of vertical conductive structures (851, 861), taken at the line A-A' as shown in FIG. 8A. A chemical mechanical planarization CMP process can then be applied over the structure, stopping at the hard mask 220 on top of the stacks of word lines.

The insulating material 751 is disposed between the word lines (311-315, 321-325, 331-335) and the vertical conductive structures (851-852, 861-862), thereby isolating the word lines from the vertical conductive structures. The word lines are recessed relative to the vertical conductive structures.

As shown in the example of FIG. 8A, a particular film of channel material (522) is in contact with a first vertical conductive structure (851) and a second vertical conductive structure (852). A second particular film of channel material (522L) is in contact with the first vertical conductive structure (851) and the second vertical conductive structure (852). The first and second vertical conductive structures are disposed on opposite sidewalls of stacks of word lines (313, 323) across a trench 351.

The trenches can have a first width 111 in the second direction (X-direction) orthogonal to the first direction (Y-direction). The vertical conductive structures can have a second width 112 in the second direction greater than the first width.

In one embodiment, the conductive material filling the holes can include N+ polysilicon. Other embodiments can include metals, metal nitrides, other metal compounds or combinations of metals and metal compounds, such as platinum, tantalum nitride, metal silicides, aluminum or other metal or metal compound gate materials (e.g. from Ti, TiN, Ta, Ru, Ir, $RuO_2$, $IrO_2$, W, WN), and others. For some applications, it is preferable to use materials having work functions higher than 4 eV, preferably higher than 4.5 eV.

FIGS. 9A, 9B, 10A, 10B, 11A, and 11B illustrate stages in the process flow for forming a plurality of bit line transistors disposed over and connected to respective vertical conductive structures.

FIGS. 9A and 9B illustrate a stage in the process flow after forming a first insulating layer (905) over the stacks of word lines (311-315, 321-325, 331-335), forming a horizontal conductive layer (910) over the first insulating layer, and forming a second insulating layer (915) over the horizontal conductive layer 910. FIG. 9A is a vertical cross sectional view of the structure taken at the line A-A' (FIG. 8A). FIG. 9A illustrates the horizontal conductive layer 910 over the stacks of word lines, and over top surfaces of the vertical conductive structures (e.g. 851, 861). FIG. 9B is a vertical cross sectional view of the structure taken at the line B-B' (FIG. 8A). FIG. 9B illustrates the conductive layer 910 over the stacks of word lines, and over the channel material 522 and the memory material 512 disposed on the sidewalls of the stacks of word lines between adjacent vertical conductive structures (e.g. 851, 852, FIG. 8A) in the first direction.

Figures 10A, 10B:
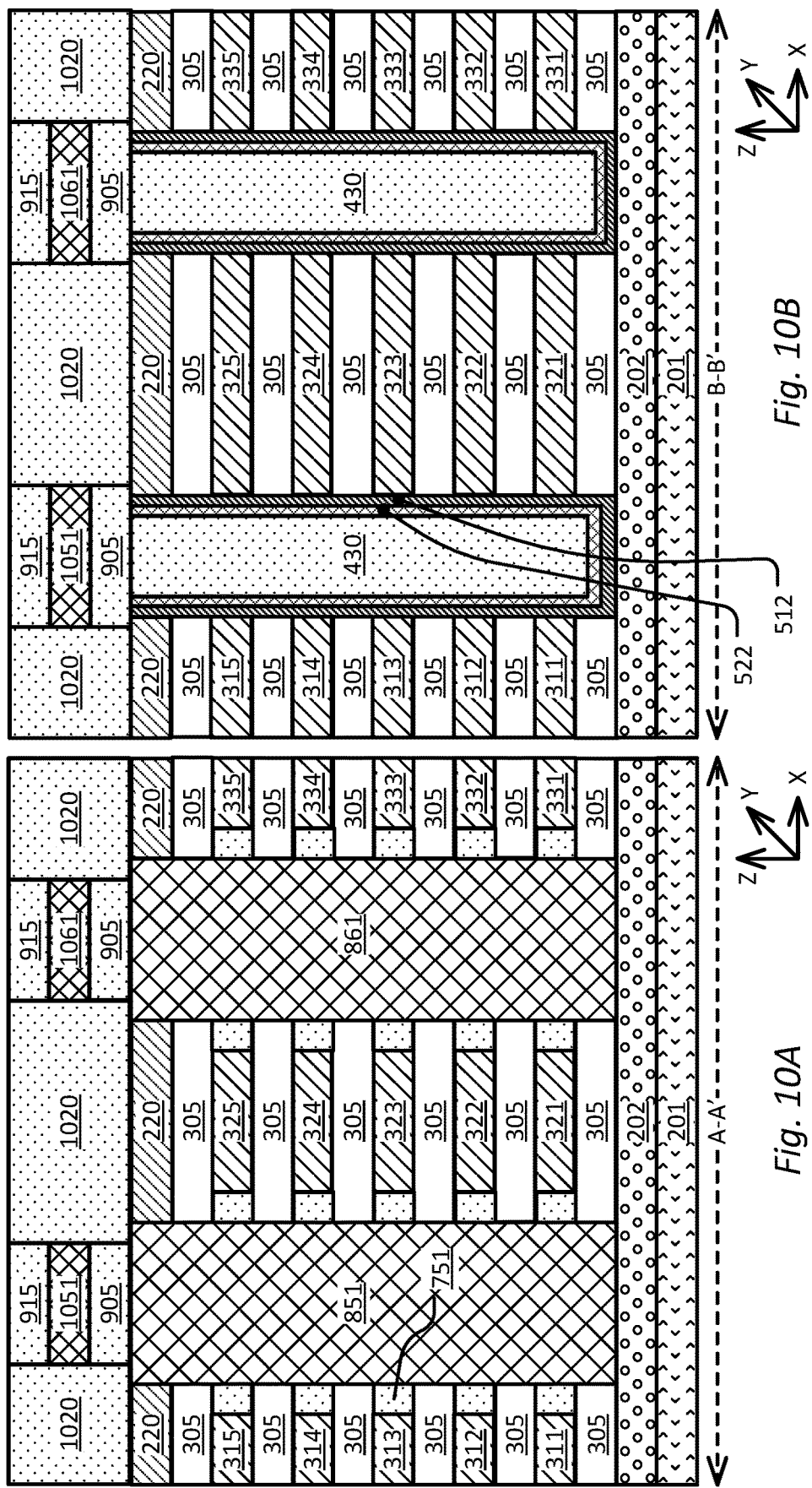

FIGS. 10A and 10B illustrate a stage in the process flow after etching the first insulating layer 905, the horizontal conductive layer 910, and the second insulating layer 915 to separate the horizontal conductive layer into gate lines (1051, 1061) over and insulated from respective columns of vertical conductive structures (851, 861). Gate lines can have a width narrower than a width of the vertical conductive structures (e.g. 851, 861) in the X-direction. FIG. 10A is a vertical cross sectional view of the structure taken at the line A-A' (FIG. 8A). The gate lines extend in the first direction (Y-direction). FIG. 10B is a vertical cross sectional view of the structure taken at the line B-B' (FIG. 8A).

FIGS. 11A and 11B illustrate stages in the process flow for forming bit line transistors and landing pads on the bit line transistors. FIG. 11A is a top view of the structure, illustrating gate lines (1051, 1061) over and connected to respective columns of vertical conductive structures (851-852, 861-862) via landing pads (1151-1152, 1161-1162). FIG. 11B is a vertical cross sectional view of the structure taken at the line A-A' as shown in FIG. 11A, illustrating bit line transistors (1110, 1120) and landing pads (1151, 1161) on the bit line transistors.

The process flow can include etching holes through the gate lines (1051, 1061) disposed over and insulated from the top surfaces of the vertical conductive structures (851, 861), stopping on the top surfaces. Insulating spacers (1121) can be formed on sidewalls of the holes through the gate lines. Films of the channel material 1131 can be formed over the insulating spacers on the sidewalls of the holes, where the films of the channel material are connected at lower ends to the vertical conductive structures. The holes through the gate lines can be filled with insulating material 1141. Landing pads (1151, 1161) can be formed over the insulating material 1141 and connected to respective films of the channel material at upper ends.

FIGS. 12A and 12B illustrate a stage in the process flow after forming a plurality of bit lines (1231, 1232) disposed over and connected to respective rows of bit line transistors (1110, 1120) in a plurality of bit line transistors. Bit lines extend in a second direction (X-direction) orthogonal to the first direction (Y-direction). Gate lines (1051, 1061) extend in the first direction. The bit lines (1231) are connected to respective rows of bit line transistors (1110, 1120) via contacts (1251, 1261) and landing pads (1151, 1161).

This stage in the process can include forming an insulating layer 1210 over the plurality of bit line transistors (1110, 1120), and etching holes through the insulating layer 1210 over the plurality of bit line transistors, stopping on the landing pads (1151, 1161). Contacts (1251, 1261) can then be formed in the holes, where the contacts are disposed over and connected to respective landing pads (1151, 1161). A conductive layer can be formed over the contacts, and etched to form the plurality of bit lines (1231).

FIG. 13 is a diagram illustrating selection of a memory cell from a NOR array of memory cells. As shown in the example of FIG. 13, a plurality of bit line transistors (1311-1314, 1321-1324, 1331-1334, 1341-1344) is disposed over and connected to respective vertical conductive structures (851, 861, 871, 881; 852, 862, 872, 882; 853, 863, 873, 883; 854, 864, 874, 884). Columns of vertical conductive structures (851-854, 861-864, 871-874, 881-884) are disposed between adjacent stacks of word lines (313, 323, 333, 343, 353). A plurality of bit lines (1231-1234) is disposed over and connected to respective rows of bit line transistors (1311-1314, 1321-1324, 1331-1334, 1341-1344) in the plurality of bit line transistors. The bit lines extend in a second direction (X-direction) orthogonal to the first direction (Y-direction).

A plurality of gate lines (1051, 1061, 1071, 1081) of the bit line transistors is disposed at a level of the bit line transistors and connected to respective columns (1311, 1321, 1331, 1341; 1312, 1322, 1332, 1342; 1313, 1323, 1333, 1343; 1314, 1324, 1334, 1344) of bit line transistors in the plurality of bit line transistors, the gate lines extending in the first direction.

A particular memory cell 1301 can have a drain in a first vertical conductive structure 851, a source in a second vertical conductive structure 852, and a channel in a particular film of channel material (522, FIG. 8A) in ohmic contact with the first and second vertical conductive structures, where the particular film of channel material is disposed on the sidewall of a particular word line 323.

Circuitry (1652, FIG. 16) connected to the bit lines (1231-1234) can apply first and second voltages to the bit lines. To select a particular memory cell (e.g. 1301), the circuitry can be configured to turn on a first bit line transistor 1311 connected to the first vertical conductive structure 851 and a second bit line transistor 1321 connected to the second vertical conductive structure 852. The first voltage can be applied to a first bit line 1231 connected to the first vertical conductive structure, the second voltage can be applied to a second bit line 1232 connected to the second vertical conductive structure, and a word line voltage can be applied to the particular word line 323.

The first and second bit lines (1231, 1232) are adjacent each other, and are disposed over the first and second vertical conductive structures (851, 852), respectively. The first voltage can be a drain side voltage (e.g. VCC) and the second voltage can be a source side voltage (e.g. 0V). The bit lines other than the first and second bit lines can be floated, when applying the first and second voltages to the first and second bit lines. The order in which the steps are shown do not necessarily indicate the order in which the steps are executed. For instance, first and second voltages can be applied before or after a word line voltage is applied. For instance, the first and second bit line transistors can be turned on before or after the word line voltage is applied to the particular word line.

For a double channel operation, the circuitry can be further configured to select a second particular memory cell 1302, in addition to selecting the first-mentioned particular memory cell 1301. The second particular memory cell 1302 can have have a drain in the first vertical conductive structure 851, a source in the second vertical conductive structure 852, and a channel in a second particular film of channel material (522L, FIG. 8A) in contact with the first and second vertical conductive structure. The second particular film of channel material is disposed on the sidewall of a second particular word line 313 opposite the first-mentioned particular word line 323 across a trench (351, FIG. 8A). The second particular film of channel material is in contact with the first and second vertical conductive structures (851, 852).

To select a second particular memory cell 1302, in addition to the steps described for selecting the first-mentioned particular memory cell 1301, the circuitry can be configured to execute steps including: further applying a second word line voltage to the second particular word line when applying the first-mentioned word line voltage to the first-mentioned particular word line.

FIGS. 14A, 14B, 14C and 14D illustrate stages of a simplified process flow for manufacturing a memory device in an alternative embodiment.

Figure 14A:
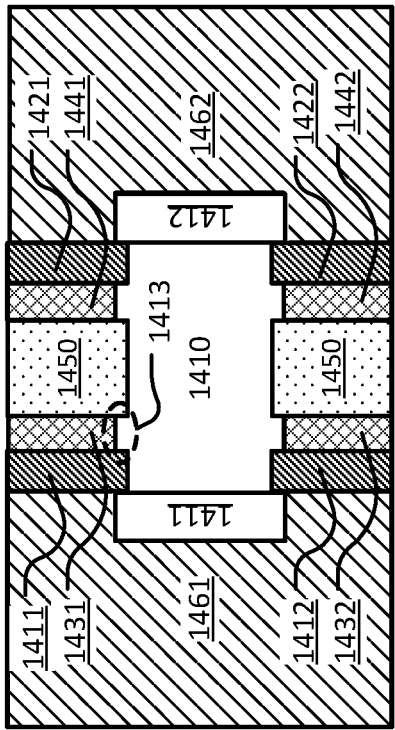
FIGS. 14A, 14B, 14C and 14D illustrate stages of a simplified process flow for manufacturing a memory device in an alternative embodiment.

FIG. 14A illustrates a stage in the process flow after etching holes (1410) between the stacks of word lines (1461, 1462) through the multi-layer films of memory material and channel material and through the insulating material 1450 in the trenches (1401). This etch step results in separating the multi-layer films of memory material and channel material into films of the memory material (1411, 1412, 1421, 1422) on the sidewalls of the word lines, and films of the channel material (1431, 1432, 1441, 1442) on the films of memory material. In one embodiment, this etch step can use RIE (Reactive-ion etching). FIG. 14A is a simplified horizontal cross sectional view of the structure of the memory device at this stage, taken at a level of word lines in the stacks. The word lines in the stacks extend in a first direction (Y-direction). The trenches 1401 and the holes 1410 can have a same width 1415 in the second direction orthogonal to the first direction.

The holes (1410) can separate the channel material into a first film of channel material (1431, 1441) and a second film of channel material (1432, 1442), where the first and second films of channel material are disposed opposite each other across a particular hole (1410) in the first direction (Y-direction). The holes can separate the memory material into a first film of memory material (1411, 1421) and a second film of memory material (1412, 1422), where the first and second films of memory material are disposed opposite each other across the particular hole 1410 in the first direction.

Figure 14B:
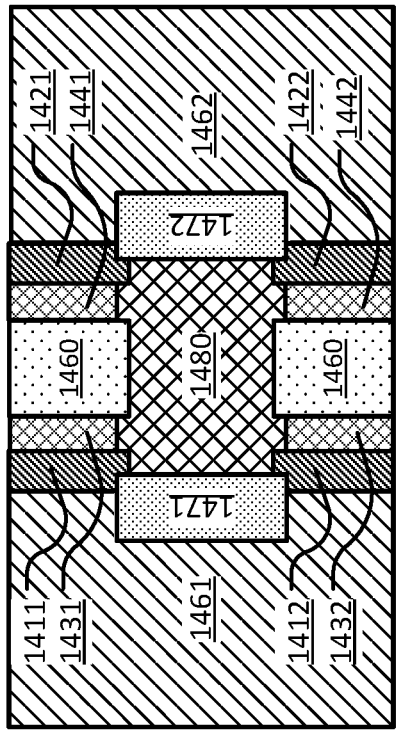

FIG. 14B illustrates a stage in the process flow after etching recesses (1141, 1142) on sidewalls of word lines (1461, 1462) in the stacks via the holes (1410). FIG. 14B is a simplified horizontal cross sectional view of the structure of the memory device at this stage, taken at a level of word lines in the stacks. In one embodiment, this etch step can use a selective etch process with a cleaning solution such as SC1 as known in the art. Here SC1 refers to a Standard Clean-1 procedure using for example a cleaning solution $H_2O_2$—$NH_4OH$—$H_2O$. The etch step may slightly etch the films of channel material (1431, 1441, 1432, 1442) as indicated by a dotted circle 1413.

Figure 14C:
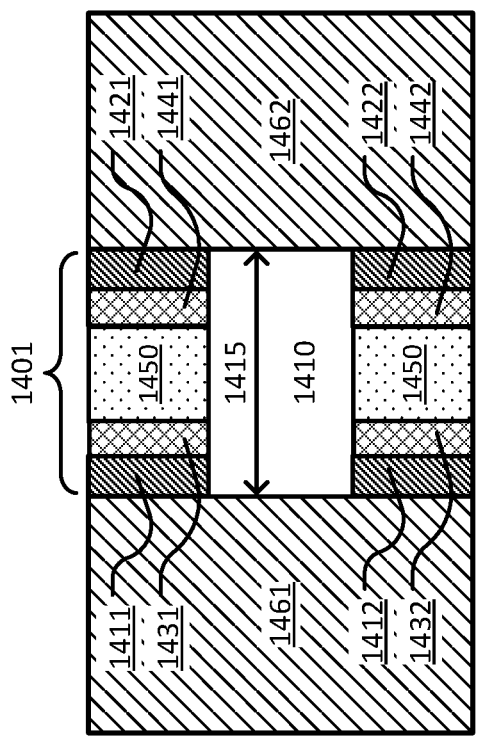

FIG. 14C illustrates a stage in the process flow after forming dielectric material (1471, 1472) in the recesses (1411, 1412) on the sidewalls of word lines in the stacks via the holes (1410). FIG. 14C is a simplified horizontal cross sectional view of the structure of the memory device at this stage, taken at a level of word lines in the stacks. In one embodiment, this step can use conformal dielectric deposition to fill in the recesses. When forming the dielectric material in the recesses, the dielectric material may be deposited on the channel material via the holes. After the insulating material is formed in the recesses, an isotropical etch can be applied to expose the channel material via the holes, so the channel material can connect to vertical conductive structures at a later stage described in reference to FIG. 14D.

Figure 14D:
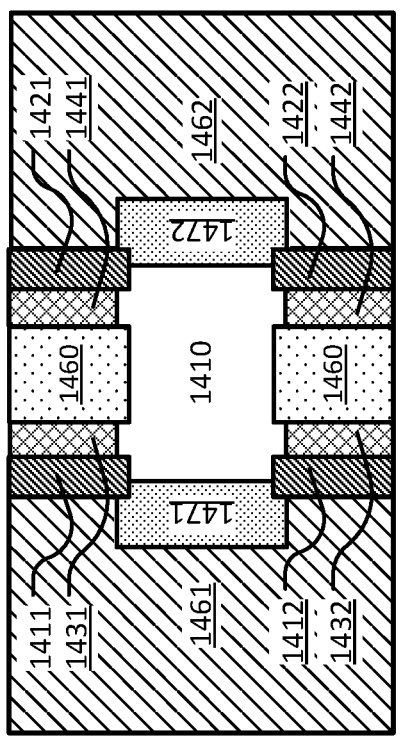

FIG. 14D illustrates a stage in the process flow after forming a plurality of columns of vertical conductive structures disposed in the trenches between adjacent stacks of word lines. FIG. 14D is a simplified horizontal cross sectional view of the structure of the memory device at this stage, taken at a level of word lines in the stacks. This stage can include filling the holes (1410) with conductive material, thereby forming a plurality of columns of vertical conductive structures (1480) disposed in the trenches (1401) between adjacent stacks (1461, 1462). In one embodiment, conformal N+ polysilicon deposition can be used to fill in the holes at this stage. A chemical mechanical planarization CMP process can then be applied over the structure.

The dielectric material (1471, 1472) is disposed between the word lines (1461, 1471) and the vertical conductive structures (1480), thereby isolating the word lines from the vertical conductive structures. The word lines are recessed relative to the vertical conductive structures.

Figure 14F:
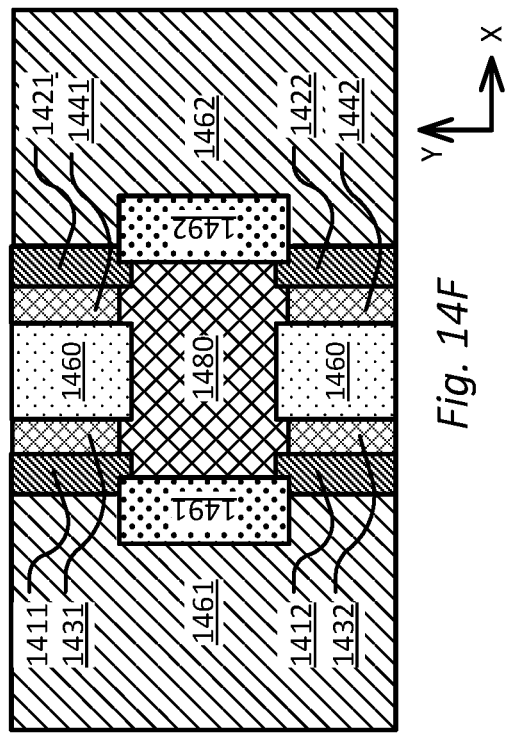
FIGS. 14E and 14F illustrate stages of a simplified process flow for manufacturing a memory device in another alternative embodiment.
Figure 14E:
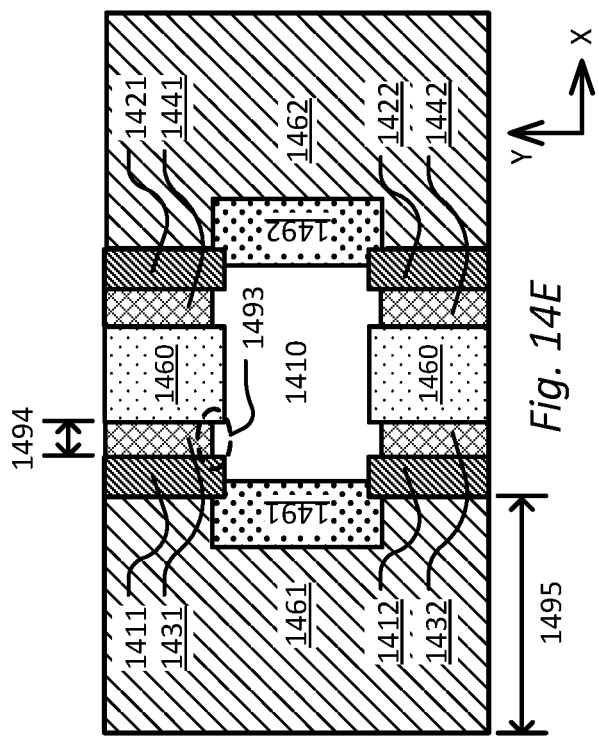

FIGS. 14E and 14F illustrate stages of a simplified process flow for manufacturing a memory device in another alternative embodiment.

FIG. 14E illustrates a stage in the process flow after oxide (1491, 1492) of the word lines is formed in the recesses. The stage shown in FIG. 14E follows the stage shown in FIG. 14B, where recesses (1411, 1412) are etched on sidewalls of word lines (1461, 1462) in the stacks via the holes (1410). FIG. 14E is a simplified horizontal cross sectional view of the structure of the memory device at this stage, taken at a level of word lines in the stacks. At this stage shown in FIG. 14E, a thermal oxidation process can be applied to word lines (1461, 1462), to form oxide (1491, 1492) of the word lines in the recesses. The films of channel material (e.g. 1431) can have a first thickness 1494, and the word lines can have a second thickness 1495 at least 5 times greater than the first thickness, depending on doping species and concentration.

The thermal oxidation process to form the oxide (1491, 1492) of the word lines in the recesses may also form oxide 1493 on sidewalls of the films of channel material. Due to the N+ polysilicon material of word lines (1461, 1462), the oxide thickness of the oxide (1491, 1492) of the word lines is about 2-5 times thicker than the oxide thickness of the oxide 1493 on sidewalls of the films of channel material. After the oxide (1491, 1492) of the word lines is formed, an isotropical etch or wet etch can be applied to remove the oxide 1493 and expose the films of channel material, so the films of channel material can connect to vertical conductive structures at a later stage described in reference to FIG. 14F. After this etch step, the oxide 1493 on sidewalls of the films of channel material is removed, but the oxide (1491, 1492) of the word lines remain, and can prevent shorting between vertical conductive structures 1480 and word lines (1461, 1462).

FIG. 14F illustrates a stage in the process flow after forming a plurality of columns of vertical conductive structures disposed in the trenches between adjacent stacks of word lines. The stage shown in FIG. 14F follows the stage shown in FIG. 14E where oxide (1491, 1492) of the word lines is formed.

FIG. 14F is a simplified horizontal cross sectional view of the structure of the memory device at this stage, taken at a level of word lines in the stacks. This stage can include filling the holes (1410) with conductive material, thereby forming a plurality of columns of vertical conductive structures (1480) disposed in the trenches (1401, FIG. 14A) between adjacent stacks (1461, 1462). In one embodiment, conformal N+ polysilicon deposition can be used to fill in the holes at this stage. A chemical mechanical planarization CMP process can then be applied over the structure.

The oxide (1491, 1492) is disposed between the word lines (1461, 1471) and the vertical conductive structures (1480), thereby isolating the word lines from the vertical conductive structures. The word lines are recessed relative to the vertical conductive structures.

Figure 15:
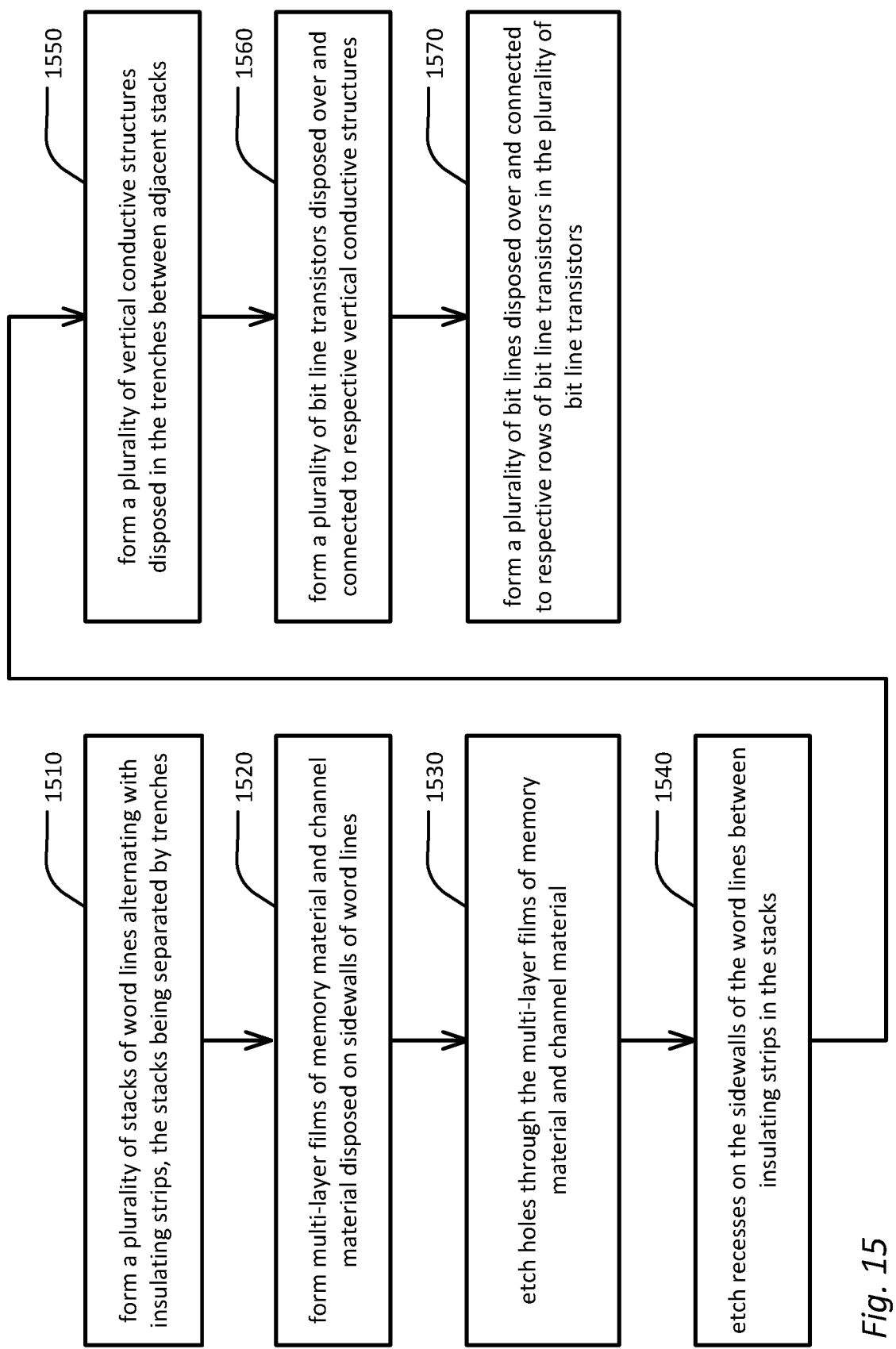
FIG. 15 is a simplified flow chart illustrating a manufacturing process for an integrated circuit memory device.

FIG. 15 is a simplified flow chart illustrating a manufacturing process for an integrated circuit memory device. At Step 1510, a plurality of stacks of word lines (311-315, 321-325, 331-335, FIGS. 3A and 3B) alternating with insulating strips 305 can be formed, where the stacks are separated by trenches. The word lines extend in a first direction (Y-direction). In one embodiment, the stacks of word lines can be formed over an insulating layer on a substrate.

At Step 1520, multi-layer films of memory material and channel material (410, 420, FIGS. 4A and 4B) can be formed on sidewalls of word lines on at least one side of the trenches. The trenches can be filled with conductive material 430 over the channel material.

At Step 1530, holes (551, 561, FIGS. 5A and 5B) can be etched through the multi-layer films of memory material and channel material. In one embodiment, the holes can be etched through the sidewalls of the word lines (FIGS. 5A and 5B). In an alternative embodiment, the holes (1410, FIG. 14A) are not etched through the sidewalls of the word lines (1461, 1462, FIG. 14A).

At Step 1540, recesses (651, FIGS. 6A and 6B) can be etched on the sidewalls of the word lines (313, 323, 333) between insulating strips in the stacks via the holes. In one embodiment, insulating material (751, FIGS. 7A and 7B) can be formed in the recesses on the sidewalls of the word lines.

At Step 1550, a plurality of vertical conductive structures (851-852, 861-862, FIGS. 8A and 8B) can be formed in the trenches (351, 361) between adjacent stacks of word lines (between 313 and 323, between 323 and 333). The insulating material (751) can be disposed between the word lines (313, 323) and the vertical conductive structures (851). The word lines (e.g. 313) are recessed relative to the vertical conductive structures (e.g. 851).

At Step 1560, a plurality of bit line transistors (1110, 1120, FIGS. 11B and 12B) can be formed over and connected to respective vertical conductive structures (851, 861).

At Step 1570, a plurality of bit lines (1231, FIGS. 12A and 12B) can be formed over and connected to respective rows of bit line transistors (1110, 1120) in the plurality of bit line transistors, the bit lines extending in a second direction (X-direction) orthogonal to the first direction (Y-direction).

The process can further include forming circuitry (1652, FIG. 16) connected to the bit lines to apply first and second voltages to the bit lines as described in reference to FIG. 13.

Figure 16:
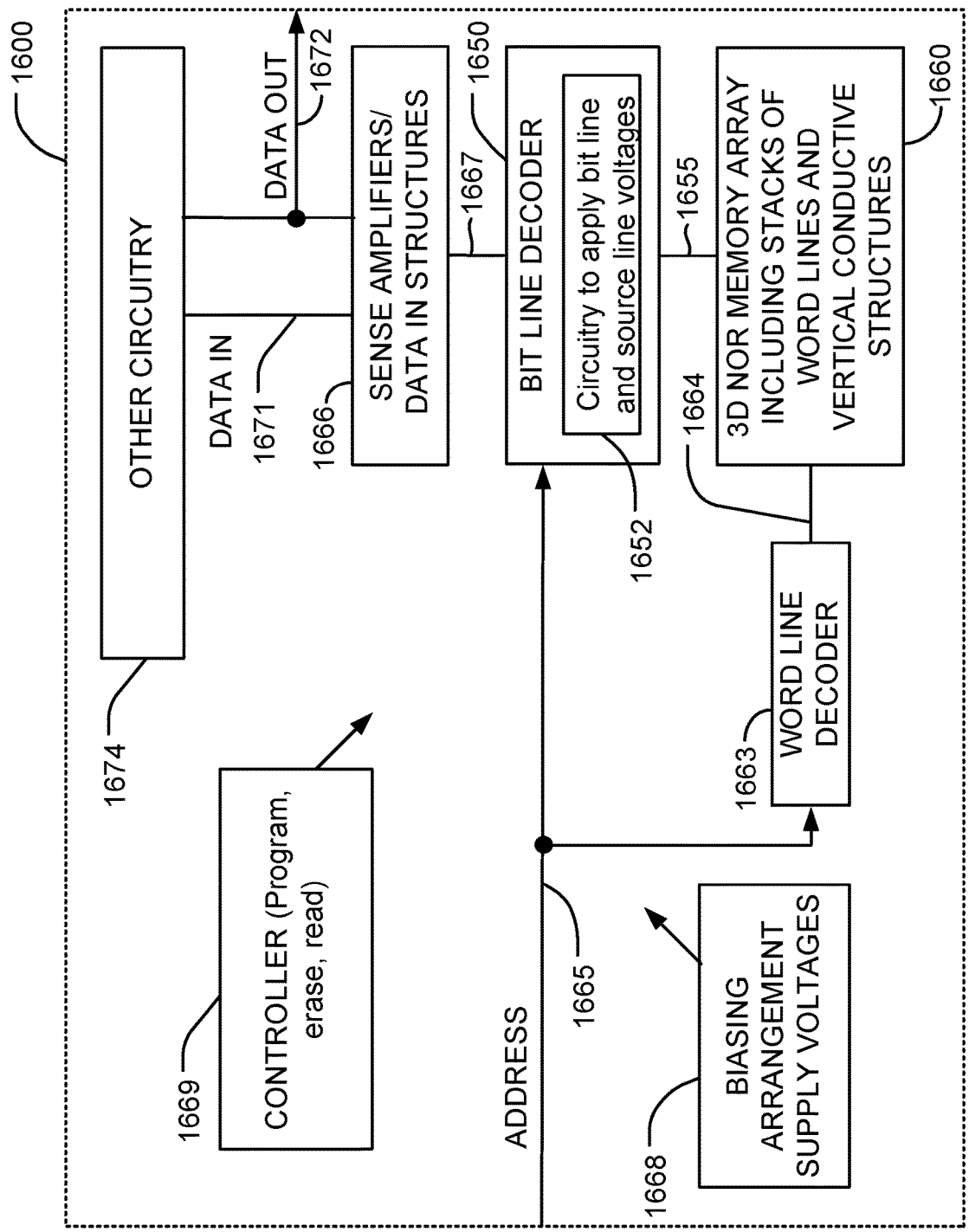
FIG. 16 a simplified block diagram of an integrated circuit memory device in accordance with the present technology.

FIG. 16 a simplified block diagram of an integrated circuit memory device in accordance with the present technology. In the example shown in FIG. 16, the integrated circuit memory device 1600 includes a 3D NOR memory array 1660 including a plurality of stacks of word lines alternating with insulating strips, the stacks being separated by trenches, the word lines extending in a first direction. The memory device can include a plurality of columns of vertical conductive structures disposed in the trenches between adjacent stacks. Insulating material (751) can be disposed in recesses on sidewalls of word lines in the stacks disposed between the word lines and the vertical conductive structures. The word lines are recessed relative to the vertical conductive structures.

Multi-layer films of memory material and channel material can be disposed on sidewalls of word lines on at least one side of the trenches between adjacent vertical conductive structures in the plurality of vertical conductive structures. The channel material is in ohmic contact with the vertical conductive structures. at locations of vertical conductive structures in the plurality of vertical conductive structures, the sidewalls of the word lines are recessed between insulating strips in the stacks to form recesses on the sidewalls of the word lines to isolate the word lines from vertical conductive structures.

The trenches can have a first width in a second direction (X-direction) orthogonal to the first direction, and the vertical conductive structures can have a second width in the second direction greater than the first width.

A particular vertical conductive structure can be in ohmic contact with a first film of channel material and a second film of channel material, where the first and second films of channel material are disposed opposite each other across the particular vertical conductive structure in the first direction.

A plurality of bit line transistors can be disposed over and connected to respective vertical conductive structures. A plurality of bit lines can be disposed over and connected to respective rows of bit line transistors in the plurality of bit line transistors, the bit lines extending in a second direction orthogonal to the first direction. A plurality of gate lines can be disposed at a level of the bit line transistors and connected to respective columns of bit line transistors in the plurality of bit line transistors, the gate lines extending in the first direction. The bit line transistors can comprise channel films connected at lower ends to respective vertical conductive structures. The bit lines can be connected to the respective rows of bit line transistors via contacts to respective upper ends of the channel films.

The memory device can include circuitry 1652 connected to the bit lines 1655 to apply first and second voltages to the bit lines. Circuitry 1652 is further described in reference to FIG. 13.

A bit line decoder 1650 can include circuitry 1652 connected to the bit lines 1655 to apply first and second voltages to the bit lines. Circuitry 1652 can be configured to select a particular memory cell in the memory array, as further described in reference to FIG. 13.

A word line decoder 1663 is coupled to a plurality of word lines 1664 for reading and programming data from the memory cells in the memory array 1660. Addresses are supplied on bus 1665 to word line decoder 1663 and bit line decoder 1650. Sense amplifiers and data-in structures in block 1666 are coupled to the bit line decoder 1650 in this example via data bus 1667. Data is supplied via the data-in line 1671 from input/output ports on the integrated circuit 1600 or from other data sources internal or external to the integrated circuit 1600, to the data-in structures in block 1666. In the illustrated embodiment, other circuitry 1674 is included on the integrated circuit, such as a general purpose processor or special purpose application circuitry, or a combination of modules providing system-on-a-chip functionality supported by the programmable resistance cell array. Data is supplied via the data-out line 1672 from the sense amplifiers in block 1666 to input/output ports on the integrated circuit 1600, or to other data destinations internal or external to the integrated circuit 1600.

A controller 1669 implemented in this example using bias arrangement state machine controls the application of bias arrangement supply voltage generated or provided through the voltage supply or supplies in block 1668, such as program, erase and read voltages.

The controller can be implemented using special-purpose logic circuitry as known in the art. In alternative embodiments, the controller comprises a general-purpose processor, which can be implemented on the same integrated circuit, which executes a computer program to control the operations of the device. In yet other embodiments, a combination of special-purpose logic circuitry and a general-purpose processor can be utilized for implementation of the controller.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
   a plurality of stacks of word lines alternating with insulating strips, the stacks being separated by trenches, the word lines extending in a first direction;
   a plurality of vertical conductive structures disposed in the trenches between adjacent stacks; and
   multi-layer films of memory material and channel material disposed on sidewalls of word lines on at least one side of the trenches between adjacent vertical conductive structures in the plurality of vertical conductive structures, the channel material in ohmic contact with the adjacent vertical conductive structures at a level of the word lines in the stacks,
   wherein at locations of vertical conductive structures in the plurality of vertical conductive structures, the sidewalls of the word lines are recessed between insulating strips in the stacks to form recesses on the sidewalls of the word lines to isolate the word lines from vertical conductive structures.

2. The memory device of claim 1, including insulating material in the recesses on the sidewalls of the word lines.

3. A memory device, comprising:
   a plurality of stacks of word lines alternating with insulating strips, the stacks being separated by trenches, the word lines extending in a first direction;
   a plurality of vertical conductive structures disposed in the trenches between adjacent stacks; and
   multi-layer films of memory material and channel material disposed on sidewalls of word lines on at least one side of the trenches between adjacent vertical conductive structures in the plurality of vertical conductive structures, the channel material in ohmic contact with the vertical conductive structures,
   wherein at locations of vertical conductive structures in the plurality of vertical conductive structures, the sidewalls of the word lines are recessed between insulating strips in the stacks to form recesses on the sidewalls of the word lines to isolate the word lines from vertical conductive structures,
   wherein the trenches have a first width in a second direction orthogonal to the first direction, and the vertical conductive structures have a second width in the second direction greater than the first width.

4. The memory device of claim 1, wherein a particular vertical conductive structure is in ohmic contact with a first film of channel material and a second film of channel material, the first and second films of channel material disposed opposite each other across the particular vertical conductive structure in the first direction.

5. The memory device of claim 1, comprising:
   a plurality of bit line transistors disposed over and connected to respective vertical conductive structures; and
   a plurality of bit lines disposed over and connected to respective rows of bit line transistors in the plurality of bit line transistors, the bit lines extending in a second direction orthogonal to the first direction.

6. The memory device of claim 5, comprising:
   a plurality of gate lines disposed at a level of the bit line transistors and connected to respective columns of bit line transistors in the plurality of bit line transistors, the gate lines extending in the first direction.

7. The memory device of claim 5, wherein the bit line transistors comprise channel films connected at lower ends to respective vertical conductive structures, the bit lines connected to the respective rows of bit line transistors via contacts to respective upper ends of the channel films.

8. The memory device of claim 5, comprising:
   circuitry connected to the bit lines to apply first and second voltages to the bit lines.

9. The memory device of claim 8, wherein
   the circuitry is configured to select a particular memory cell having a drain in a first vertical conductive structure, a source in a second vertical conductive structure, and a channel in a particular film of channel material in ohmic contact with the first and second adjacent vertical conductive structures at a level of the word lines in the stacks and disposed on the sidewall of a particular word line, including:
   turning on a first bit line transistor connected to the first vertical conductive structure and a second bit line transistor connected to the second vertical conductive structure;
   applying the first voltage to a first bit line connected to the first vertical conductive structure;
   applying the second voltage to a second bit line connected to the second vertical conductive structure; and
   applying a word line voltage to the particular word line.

10. The memory device of claim 2, wherein the insulating material in the recesses on the sidewalls of the word lines includes dielectric material.

11. The memory device of claim 2, wherein the insulating material in the recesses on the sidewalls of the word lines includes oxide of the word lines.

12. A manufacturing method, comprising:
    forming a plurality of stacks of word lines alternating with insulating strips, the stacks being separated by trenches, the word lines extending in a first direction;
    forming multi-layer films of memory material and channel material disposed on sidewalls of word lines on at least one side of the trenches;
    etching holes through the multi-layer films of memory material and channel material;
    etching recesses on the sidewalls of the word lines between insulating strips in the stacks; and
    forming a plurality of vertical conductive structures disposed in the trenches between adjacent stacks, the multi-layer films of memory material and channel material disposed between adjacent vertical conductive structures in the plurality of vertical conductive structures, the channel material in ohmic contact with the adjacent vertical conductive structures at a level of the word lines in the stacks, wherein the recesses isolate the word lines from the vertical conductive structures.

13. The method of claim 12, comprising:

forming insulating material in the recesses on the sidewalls of the word lines.

14. The method of claim 12, wherein the trenches have a first width in a second direction orthogonal to the first direction, and the vertical conductive structures have a second width in the second direction greater than the first width.

15. The method of claim 12, comprising:

filling the trenches with insulating material over the channel material; and said etching holes including etching through the insulating material in the trenches.

16. The method of claim 12, comprising:

forming a plurality of bit line transistors disposed over and connected to respective vertical conductive structures; and forming a plurality of bit lines disposed over and connected to respective rows of bit line transistors in the plurality of bit line transistors, the bit lines extending in a second direction orthogonal to the first direction.

17. The method of claim 16, comprising:

forming a plurality of gate lines disposed at a level of the bit line transistors and connected to respective columns of bit line transistors in the plurality of bit line transistors, the gate lines extending in the first direction.

18. The method of claim 17, said forming the plurality of bit line transistors comprising:

forming a first insulating layer over the stacks of word lines, including over top surfaces of the vertical conductive structures;

forming a horizontal conductive layer over the first insulating layer;

forming a second insulating layer over the horizontal conductive layer; and etching the first insulating layer, the horizontal conductive layer and the second insulating layer to separate the horizontal conductive layer into the gate lines over and insulated from respective columns of vertical conductive structures.

19. The method of claim 18, comprising:

etching holes through the gate lines over the top surfaces of the vertical conductive structures, stopping on the top surfaces;

forming insulating spacers on sidewalls of the holes through the gate lines;

forming films of the channel material over the insulating spacers on the sidewalls of the holes, the films of the channel material connected at lower ends to the vertical conductive structures; and filling the holes through the gate lines with insulating material; and forming landing pads connected to respective channel films at upper ends.

20. The method of claim 17, said forming the plurality of bit lines comprising:

forming an insulating layer over the plurality of bit line transistors;

etching holes through the insulating layer over the plurality of bit line transistors, stopping on the landing pads;

forming the contacts in the holes, the contacts disposed over and connected to respective landing pads;

forming a conductive layer over the contacts; and etching the conductive layer to form the plurality of bit lines.

* * * * *